United States Patent
Nakahara et al.

(10) Patent No.: US 12,498,639 B2
(45) Date of Patent: Dec. 16, 2025

(54) MATERIAL FOR FORMING ADHESIVE FILM, METHOD FOR FORMING ADHESIVE FILM USING THE SAME, AND PATTERNING PROCESS USING MATERIAL FOR FORMING ADHESIVE FILM

(71) Applicant: SHIN-ETSU CHEMICAL CO., LTD., Tokyo (JP)

(72) Inventors: Takayoshi Nakahara, Joetsu (JP); Yusuke Biyajima, Joetsu (JP); Yuji Harada, Joetsu (JP); Tsutomu Ogihara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 625 days.

(21) Appl. No.: 17/842,877

(22) Filed: Jun. 17, 2022

(65) Prior Publication Data

US 2023/0059089 A1 Feb. 23, 2023

(30) Foreign Application Priority Data

Jul. 6, 2021 (JP) .................................. 2021-112381

(51) Int. Cl.
*G03F 7/09* (2006.01)
*C09J 125/18* (2006.01)
(Continued)

(52) U.S. Cl.
CPC ............ *G03F 7/094* (2013.01); *C09J 125/18* (2013.01); *C09J 133/14* (2013.01);
(Continued)

(58) Field of Classification Search
CPC ..... C09J 125/18; C09J 133/14; G03F 7/0382; G03F 7/0752; G03F 7/0757; G03F 7/094;
(Continued)

(56) References Cited

U.S. PATENT DOCUMENTS

2004/0053162 A1 3/2004 Uenishi et al.
2004/0197709 A1 10/2004 Arase et al.
(Continued)

FOREIGN PATENT DOCUMENTS

CN 112987495 A 6/2021
EP 3 395 845 A1 10/2018
(Continued)

OTHER PUBLICATIONS

Jan. 12, 2024 Office Action issued in Korean Patent Application No. 10-2022-0081129.
(Continued)

*Primary Examiner* — Edward Chin
(74) *Attorney, Agent, or Firm* — Oliff PLC

(57) ABSTRACT

The present invention is a material for forming an adhesive film formed between a silicon-containing middle layer film and a resist upper layer film, the material for forming an adhesive film containing: (A) a resin having a structural unit shown by the following general formula (1); (B) a cross-linking agent containing one or more compounds shown by the following general formula (2); (C) a photo-acid generator; and (D) an organic solvent. This provides: a material for forming an adhesive film in a fine patterning process by a multilayer resist method in a semiconductor device manufacturing process, where the material gives an adhesive film that has high adhesiveness to a resist upper layer film, has an effect of suppressing fine pattern collapse, and that also makes it possible to form an excellent pattern profile; a patterning process using the material; and a method for forming the adhesive film.

(Continued)

(1)

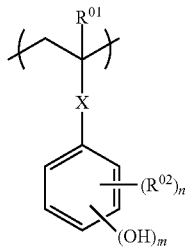

(2)

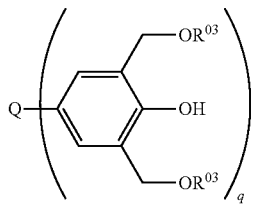

18 Claims, 2 Drawing Sheets

(51) Int. Cl.
*C09J 133/14* (2006.01)
*G03F 7/075* (2006.01)
*G03F 7/11* (2006.01)
*H01L 21/033* (2006.01)
*H01L 21/311* (2006.01)

(52) U.S. Cl.
CPC .............. *G03F 7/0757* (2013.01); *G03F 7/11* (2013.01); *H01L 21/0337* (2013.01); *H01L 21/31116* (2013.01)

(58) Field of Classification Search
CPC ........ G03F 7/095; G03F 7/11; H01L 21/0337; H01L 21/31116
See application file for complete search history.

(56) References Cited

U.S. PATENT DOCUMENTS

| | | |
|---|---|---|
| 2011/0189609 A1 | 8/2011 | Kawabata et al. |
| 2012/0288795 A1 | 11/2012 | Umezaki et al. |
| 2016/0005595 A1 | 1/2016 | Liu et al. |
| 2016/0342088 A1 | 11/2016 | Hatakeyama et al. |
| 2019/0010108 A1 | 1/2019 | Toida et al. |
| 2020/0090935 A1 | 3/2020 | Ogihara et al. |
| 2020/0124965 A1 | 4/2020 | Nishita et al. |
| 2021/0181637 A1 | 6/2021 | Kori et al. |
| 2021/0394233 A1* | 12/2021 | Chang ................ B05D 7/57 |

FOREIGN PATENT DOCUMENTS

| | | | | |
|---|---|---|---|---|
| EP | 3 835 380 A1 | | 6/2021 | |
| JP | 2002-049149 A | | 2/2002 | |
| JP | 2002-334869 A | | 11/2002 | |
| JP | 2004094029 A | * | 3/2004 | ............... G03F 7/11 |
| JP | 2004-115630 A | | 4/2004 | |
| JP | 2007-199653 A | | 8/2007 | |
| JP | 2009-269953 A | | 11/2009 | |
| JP | 2013-253227 A | | 12/2013 | |
| JP | 5708938 B2 | | 4/2015 | |
| KR | 10-2016-0135669 A | | 11/2016 | |
| KR | 20160135669 A | * | 11/2016 | ............... C08G 8/24 |
| KR | 10-2020-0031052 A | | 3/2020 | |
| KR | 20200031052 A | * | 3/2020 | ............ G03F 7/038 |
| WO | 2003/017002 A1 | | 2/2003 | |
| WO | 2004/066377 A1 | | 8/2004 | |
| WO | 2018/143359 A1 | | 8/2018 | |
| WO | 2019/044510 A1 | | 3/2019 | |

OTHER PUBLICATIONS

May 31, 2024 Office Action issued in Taiwanese Patent Application No. 111124895.

Dec. 5, 2022 Extended European Search Report issued in European Patent Application No. 22181447.8.

Nov. 12, 2024 Office Action issued in Chinese Patent Application No. 202210791887.5.

\* cited by examiner

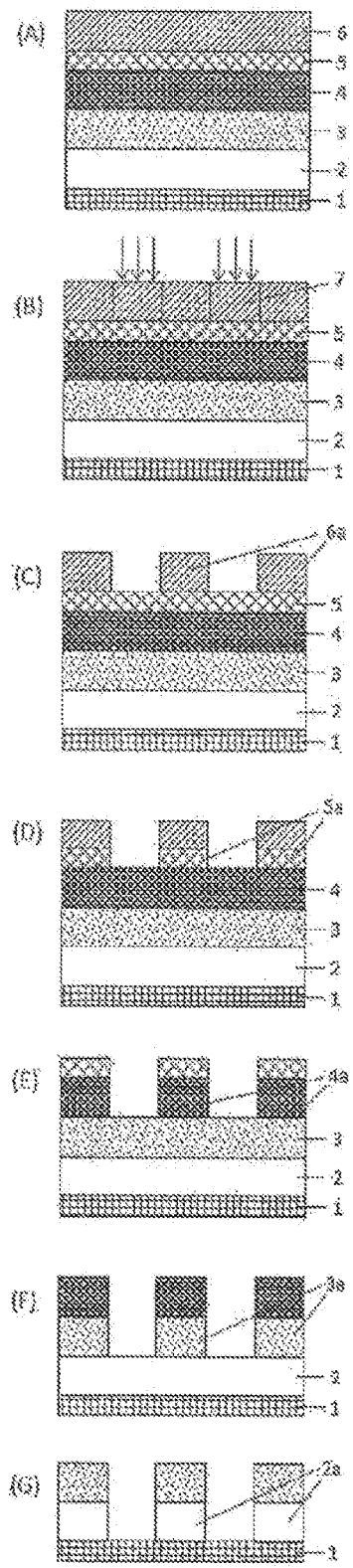
[FIG. 1]

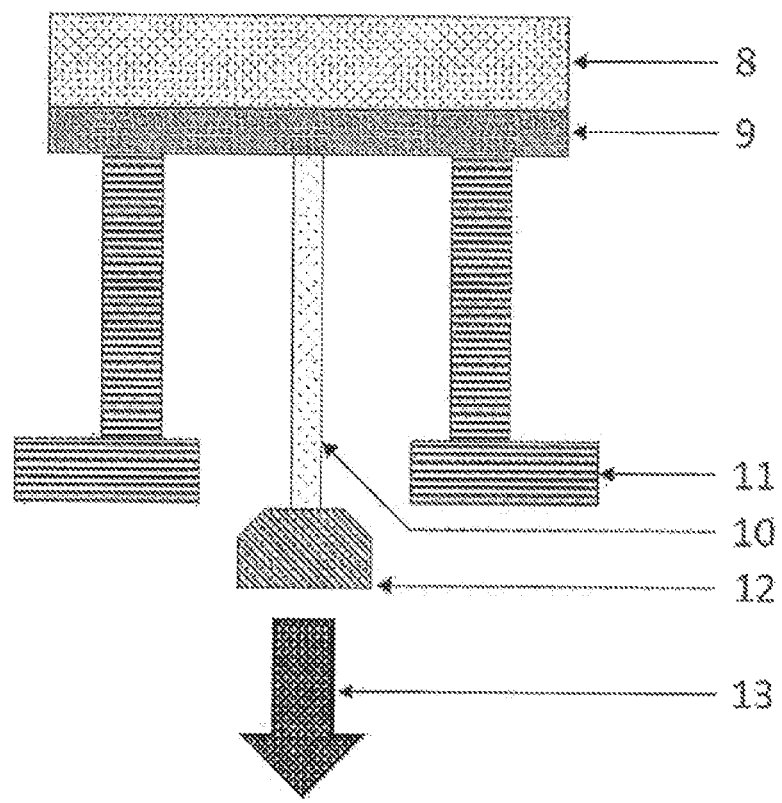
[FIG. 2]

MATERIAL FOR FORMING ADHESIVE FILM, METHOD FOR FORMING ADHESIVE FILM USING THE SAME, AND PATTERNING PROCESS USING MATERIAL FOR FORMING ADHESIVE FILM

TECHNICAL FIELD

The present invention relates to: a material for forming an adhesive film; a method for forming an adhesive film by using the material for forming an adhesive film; and a patterning process using the material for forming an adhesive film.

BACKGROUND ART

As LSI advances toward high integration and high processing speed, miniaturization of pattern size is progressing rapidly. Along with the miniaturization, lithography technology has achieved a fine patterning by shortening the wavelength of a light source and selecting an appropriate resist composition accordingly. The composition mainly used is a positive photoresist composition for monolayer. The monolayer positive photoresist composition not only allows a resist resin to have a skeleton having etching resistance against dry etching with chlorine- or fluorine-based gas plasma, but also provides a resist mechanism that makes an exposed part soluble, thereby dissolving the exposed part to form a pattern and processing a substrate to be processed coated with a photoresist composition by dry etching while using the remaining resist pattern as an etching mask.

However, when the pattern becomes finer, that is, the pattern width is reduced without changing the thickness of the photoresist film to be used, resolution performance of the photoresist film is lowered. In addition, pattern development of the photoresist film with a developer excessively increases a so-called aspect ratio of the pattern, resulting in pattern collapse. Therefore, the film thickness of the photoresist film has been thinned along with the miniaturization.

On the other hand, a substrate to be processed has been generally processed by dry etching while using a pattern-formed photoresist film as an etching mask. In practice, however, there is no dry etching method capable of providing an absolute etching selectivity between the photoresist film and the substrate to be processed. The photoresist film is thus damaged during processing of the substrate to be processed and the photoresist film collapses during processing of the substrate to be processed, so that the resist pattern cannot be transferred accurately to the substrate to be processed. Accordingly, higher dry etching resistance has been required in a photoresist composition accompanying miniaturization of the pattern. In addition, resins used for photoresist compositions have been required to have low absorbance at the wavelength to be used for the exposure owing to the shortening of the exposure wavelength. Accordingly, along with the shift from i-beam to KrF and to ArF, the resin also shifts to novolak resins, polyhydroxystyrene, and resins having an aliphatic polycyclic skeleton. This shift actually accelerates an etching rate under the dry etching conditions, and recent photoresist compositions having high resolution tend to have low etching resistance.

As a result, a substrate to be processed has to be dry-etched with a thinner photoresist film having lower etching resistance. A material for this process and the process itself are urgently needed.

A multilayer resist method is one solution for these problems. This method is as follows: a middle layer film having a different etching selectivity from a photoresist film (i.e., a resist upper layer film) is placed between the resist upper layer film and a substrate to be processed; a pattern is formed in the resist upper layer film; then, the pattern is transferred to the middle layer film by dry etching while using the resist upper layer film pattern as a dry etching mask; and the pattern is further transferred to the substrate to be processed by dry etching while using the middle layer film as a dry etching mask.

One of the multilayer resist methods is a 3-layer resist method, which can be performed with a typical resist composition used in the monolayer resist method. For example, this 3-layer resist method includes the following steps: an organic film containing a novolak or the like is formed as a resist underlayer film on a substrate to be processed; a silicon-containing film is formed thereon as a silicon-containing resist middle layer film; and a usual organic photoresist film is formed thereon as a resist upper layer film. Since the organic resist upper layer film exhibits a favorable etching selectivity ratio relative to the silicon-containing resist middle layer film when dry etching is performed with fluorine-based gas plasma, the resist upper layer film pattern is transferred to the silicon-containing resist middle layer film by dry etching with fluorine-based gas plasma. Furthermore, when etching is performed using oxygen gas or hydrogen gas, the silicon-containing resist middle layer film exhibits a favorable etching selectivity ratio relative to the resist underlayer film, so that the silicon-containing middle layer film pattern is transferred to the resist underlayer film by etching with oxygen gas or hydrogen gas. According to this process, even when using a photoresist composition which is difficult to form a pattern in so that the pattern has a sufficient film thickness for directly processing the substrate to be processed or a photoresist composition which does not have sufficient dry etching resistance for processing the substrate, a pattern can be transferred to a silicon-containing film (silicon-containing resist middle layer film). In this manner, it is possible to obtain a pattern of an organic film (resist underlayer film) containing a novolak or the like having a sufficient dry etching resistance for the processing.

Meanwhile, the recent advents of ArF immersion lithography, EUV lithography, and so forth start to realize finer pattern formations. On the other hand, ultrafine patterns have such small contact areas that the patterns quite easily collapse. Suppressing such pattern collapse is an enormous challenge. Recently, it is regarded that the interaction in the interface between the resist upper layer film and the resist underlayer film in fine patterns has an effect on pattern collapse, and the improvement of the performance of resist underlayer films is also considered necessary.

A material is reported that improves adhesiveness to a resist upper layer film by the use of a resist underlayer film containing a polar functional group such as a lactone structure or a urea structure in order to suppress pattern collapse (Patent Documents 1, 2). However, in the present situation, where the formation of finer patterns is required, these materials cannot be said to have sufficient pattern collapse suppression performance. Furthermore, there is report of a resist underlayer film that combines a phenolic hydroxy group-containing resin and a vinylether group-containing compound, but thermosetting property cannot be regarded as sufficient (Patent Document 3). From the above, a material having higher pattern collapse suppression performance and higher adhesiveness is desired.

CITATION LIST

Patent Literature

Patent Document 1: WO 2003/017002 A1
Patent Document 2: WO 2018/143359 A1
Patent Document 3: JP 5708938 B2

SUMMARY OF INVENTION

Technical Problem

The present invention has been made in view of the above-described circumstances. An object of the present invention is to provide: a material for forming an adhesive film in a fine patterning process by a multilayer resist method in a semiconductor device manufacturing process, where the material gives an adhesive film that has high adhesiveness to a resist upper layer film, has an effect of suppressing fine pattern collapse, and that also makes it possible to form an excellent pattern profile; a patterning process using the material; and a method for forming the adhesive film.

Solution to Problem

To achieve the object, the present invention provides a material for forming an adhesive film formed between a silicon-containing middle layer film and a resist upper layer film, the material for forming an adhesive film comprising: (A) a resin having a structural unit shown by the following general formula (1); (B) a crosslinking agent containing one or more compounds shown by the following general formula (2); (C) a photo-acid generator; and (D) an organic solvent,

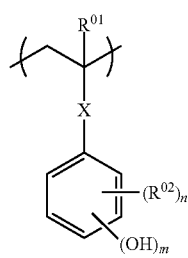

(1)

wherein $R^{01}$ represents a hydrogen atom or a methyl group, $R^{02}$ represents an alkyl group having 1 to 3 carbon atoms, "m" represents an integer of 1 or 2, "n" represents an integer of 0 to 4, m+n is an integer of 1 or more and 5 or less, and X represents a single bond or an alkylene group having 1 to 10 carbon atoms and optionally containing an oxygen atom,

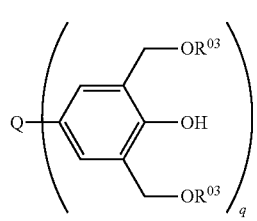

(2)

wherein Q represents a single bond or a hydrocarbon group with a valency of "q" having 1 to 20 carbon atoms, $R^{03}$ represents a hydrogen atom or a methyl group, and "q" represents an integer of 1 to 5.

Using such a material for forming an adhesive film, it is possible to form an adhesive film that has high adhesiveness to a resist upper layer film, has an effect of suppressing fine pattern collapse, and also gives a favorable pattern profile.

Furthermore, in the present invention, the silicon-containing middle layer film is preferably a silicon-containing resist middle layer film or an inorganic hard mask middle layer film.

In the present invention, such middle layer films can be used suitably as the silicon-containing middle layer film.

Furthermore, the present invention preferably comprises one or more compounds shown by the following general formula (3) as the photo-acid generator (C),

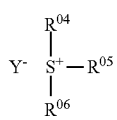

(3)

wherein $R^{04}$, $R^{05}$, and $R^{06}$ each independently represent a linear alkyl group or alkenyl group having 1 to 10 carbon atoms or a branched or cyclic alkyl group or alkenyl group having 3 to 10 carbon atoms, optionally substituted with a heteroatom, and optionally having an intervening heteroatom, or represent an aryl group or aralkyl group having 6 to 18 carbon atoms, optionally substituted with a heteroatom, and optionally having an intervening heteroatom, wherein any two of $R^{04}$, $R^{05}$, and $R^{06}$ are optionally bonded with each other to form a ring with the sulfur atom in the formula, and $Y^-$ represents one of the following general formulae (4) and (5),

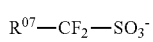

(4)

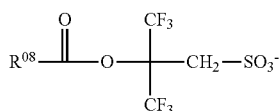

(5)

wherein $R^{07}$ and $R^{08}$ each independently represent a monovalent hydrocarbon group containing an aliphatic ring structure having 3 to 40 carbon atoms, optionally substituted with a heteroatom, and optionally having an intervening heteroatom.

Such a material for forming an adhesive film has an effect of suppressing fine pattern collapse and allows an appropriate adjustment of pattern profile, exposure sensitivity, and so forth of a resist upper layer film.

In this event, the general formula (4) is preferably shown by the following general formula (4'),

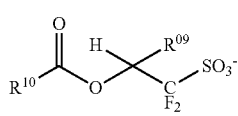

(4')

wherein $R^{09}$ represents a hydrogen atom or a trifluoromethyl group, and $R^{10}$ represents a monovalent hydrocarbon group containing an aliphatic ring structure having 3 to 30 carbon atoms, optionally substituted with a heteroatom, and optionally having an intervening heteroatom.

Such a material for forming an adhesive film has sufficient acidity, allows an appropriate adjustment of acid diffusion, and is also effective for the reduction of residue derived from the resist upper layer film in some cases.

Furthermore, in the present invention, the X in the general formula (1) preferably represents —C(=O)O—.

Using such a material for forming an adhesive film, it is possible to form an adhesive film having higher adhesiveness to the resist upper layer film and having an effect of suppressing fine pattern collapse.

Furthermore, in the present invention, the resin (A) preferably has a weight-average molecular weight of 1,000 to 20,000.

A material for forming an adhesive film containing a resin having a weight-average molecular weight within such a range has excellent film-formability. In addition, the generation of a sublimation product during heat-curing can be suppressed and the contamination of apparatuses due to sublimation products can be suppressed. Moreover, the generation of coating defects can be suppressed, so that an even more excellent material for forming an adhesive film can be achieved.

Furthermore, in the present invention, a contained amount of the crosslinking agent (B) is preferably 10 mass % to 50 mass % based on a contained amount of the resin (A).

Using such a material for forming an adhesive film, crosslinking reactivity is increased, so that the solvent resistance of the adhesive film is enhanced. In addition, it is possible to form an adhesive film maintaining high adhesiveness to the resist upper layer film.

Furthermore, in the present invention, a contained amount of the photo-acid generator (C) is preferably 1 mass % to 20 mass % based on a contained amount of the resin (A).

Such a material for forming an adhesive film makes it possible to adjust the pattern profile, exposure sensitivity, and so forth of the resist upper layer film appropriately, and is suitable for photolithography of a resist upper layer film.

Furthermore, the present invention preferably further comprises one or more out of a surfactant, a plasticizer, and a colorant.

It is possible to make fine adjustments to performance according to customer requirements, for example, film-formability, filling property, and optical characteristics by the presence, absence, or choice of these additives, and this is favorable for practicality.

Furthermore, the present invention preferably comprises no thermal acid generator.

Such a material for forming an adhesive film can prevent the surface of the adhesive film tending to acidity after baking and the generated acid being diffused in the resist upper layer film, making the pattern profile an undercut profile and inducing pattern collapse, or contrariwise, a trailing profile.

In addition, the present invention provides a patterning process for forming a pattern in a substrate to be processed, comprising the steps of:
 (I-1) forming a resist underlayer film on the substrate to be processed;
 (I-2) forming a silicon-containing resist middle layer film on the resist underlayer film;
 (I-3) applying the above-described material for forming an adhesive film on the silicon-containing resist middle layer film and then performing a heat treatment to form an adhesive film;
 (I-4) forming a resist upper layer film on the adhesive film by using a photoresist material;
 (I-5) subjecting the resist upper layer film to pattern exposure and then to development with a developer to form a pattern in the resist upper layer film;
 (I-6) transferring the pattern to the adhesive film by dry etching while using the resist upper layer film having the formed pattern as a mask;
 (I-7) transferring the pattern to the silicon-containing resist middle layer film by dry etching while using the adhesive film having the formed pattern as a mask; and
 (I-8) transferring the pattern to the resist underlayer film by dry etching while using the silicon-containing resist middle layer film having the transferred pattern as a mask.

In addition, the present invention provides a patterning process for forming a pattern in a substrate to be processed, comprising the steps of:
 (II-1) forming a resist underlayer film on the substrate to be processed;
 (II-2) forming an inorganic hard mask middle layer film selected from a silicon oxide film, a silicon nitride film, and a silicon oxynitride film on the resist underlayer film;
 (II-3) applying the above-described material for forming an adhesive film on the inorganic hard mask middle layer film and then performing a heat treatment to form an adhesive film;
 (II-4) forming a resist upper layer film on the adhesive film by using a photoresist material;
 (II-5) subjecting the resist upper layer film to pattern exposure and then to development with a developer to form a pattern in the resist upper layer film;
 (II-6) transferring the pattern to the adhesive film by dry etching while using the resist upper layer film having the formed pattern as a mask;
 (II-7) transferring the pattern to the inorganic hard mask middle layer film by dry etching while using the adhesive film having the formed pattern as a mask; and
 (II-8) transferring the pattern to the resist underlayer film by dry etching while using the inorganic hard mask middle layer film having the transferred pattern as a mask.

As described, the inventive material for forming an adhesive film can be used suitably for various patterning processes such as a 4-layer resist process in which the adhesive film is formed on the silicon-containing middle layer film (silicon-containing resist middle layer film, inorganic hard mask middle layer film). According to these patterning processes, pattern collapse can be relieved effectively by the formation of the adhesive film, and these patterning processes are suitable for photolithography of a resist upper layer film.

In this event, the inorganic hard mask middle layer film is preferably formed by a CVD method or an ALD method.

Furthermore, in the present invention, photolithography at a wavelength of 10 nm or more to 300 nm or less, a direct drawing by electron beam, a nanoimprinting, or a combination thereof is preferably employed as a method for forming a circuit pattern in the resist upper layer film.

Furthermore, in the present invention, alkaline development or development with an organic solvent is preferably employed as a development method.

In the present invention, pattern formation can be performed favorably and efficiently according to such a patterning process.

Furthermore, in the present invention, the substrate to be processed is preferably a semiconductor device substrate or the semiconductor device substrate coated with any of a metal film, a metal carbide film, a metal oxide film, a metal nitride film, a metal oxycarbide film, and a metal oxynitride film.

In this event, as the metal, silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof is preferably used.

According to the inventive patterning processes, the substrates to be processed described above can be processed in the above manner to form a pattern.

In addition, the present invention provides a method for forming an adhesive film that functions as an adhesive layer employed in a semiconductor device manufacturing process, the method comprising:
spin-coating a substrate to be processed with the above-described material for forming an adhesive film; and
heating the substrate coated with the material for forming an adhesive film at a temperature of 100° C. or higher to 300° C. or lower for 10 to 600 seconds to form a cured film.

In addition, the present invention provides a method for forming an adhesive film that functions as an adhesive layer employed in a semiconductor device manufacturing process, the method comprising:
spin-coating a substrate to be processed with the above-described material for forming an adhesive film; and
heating the substrate coated with the material for forming an adhesive film in an atmosphere having an oxygen concentration of 0.1% or more to 21% or less to form a cured film.

According to such methods, the crosslinking reaction during formation of the adhesive film can be promoted, so that mixing with the resist upper layer film can be more highly suppressed. Furthermore, by adjusting the heating temperature, time, and oxygen concentration appropriately within the above-described ranges, an effect of suppressing pattern collapse of the adhesive film suited to the usage can be provided, and in addition, pattern profile adjustment properties of the resist upper layer film can be achieved.

In addition, the present invention provides a method for forming an adhesive film that functions as an adhesive layer employed in a semiconductor device manufacturing process, the method comprising:
spin-coating a substrate to be processed with the above-described material for forming an adhesive film; and
heating the substrate coated with the material for forming an adhesive film in an atmosphere having an oxygen concentration of less than 0.1% to form a cured film.

According to such a method, the substrate to be processed is not degraded, the crosslinking reaction during formation of the adhesive film can be promoted, and intermixing with the upper layer film can be suppressed more highly even when the substrate to be processed contains a material that is unstable to heating under an oxygen atmosphere. Therefore, such a method is useful.

Advantageous Effects of Invention

As described above, according to the present invention, it is possible to provide a material for forming an adhesive film having high adhesiveness to a resist upper layer film and having an effect of suppressing fine pattern collapse. Moreover, this material for forming an adhesive film has high adhesiveness and has an effect of suppressing fine pattern collapse, and also makes it possible to make appropriate adjustments to the pattern profile, exposure sensitivity, and so forth of the resist upper layer film. Therefore, the material is extremely useful in multilayer resist processes, for example, a 4-layer resist process in which the adhesive film is formed on a silicon-containing middle layer film. In addition, according to the inventive method for forming an adhesive film, it is possible to form an adhesive film that cures sufficiently on a substrate to be processed and has high adhesiveness to a resist upper layer film. In addition, according to the inventive patterning process, a fine pattern can be formed in a substrate to be processed with high precision in a multilayer resist process.

BRIEF DESCRIPTION OF DRAWINGS

FIG. 1 is an explanatory diagram of an example of an inventive patterning process according to a 4-layer resist process.

FIG. 2 is an explanatory diagram showing a method for measuring the adhesiveness in Examples.

DESCRIPTION OF EMBODIMENTS

As described above, there have been demands for: a material for forming an adhesive film that has high adhesiveness to a resist upper layer film and has an effect of suppressing fine pattern collapse in a fine patterning process according to a multilayer resist method in a semiconductor device manufacturing process; a patterning process using the material; and a method for forming an adhesive film.

The present inventors have earnestly studied the above-described problems and investigated materials for forming an adhesive film having high adhesiveness to a resist upper layer film by the formation of an adhesive film and having an effect of suppressing fine pattern collapse in multilayer lithography, and also investigated patterning processes using the materials. As a result, the present inventors have found out that a material for forming an adhesive film having, as a main component, a compound having a certain structure, a patterning process using the material, and a method for forming an adhesive film are extremely effective, and completed the present invention.

That is, the present invention is a material for forming an adhesive film formed between a silicon-containing middle layer film and a resist upper layer film, the material for forming an adhesive film comprising: (A) a resin having a structural unit shown by the following general formula (1); (B) a crosslinking agent containing one or more compounds shown by the following general formula (2); (C) a photoacid generator; and (D) an organic solvent,

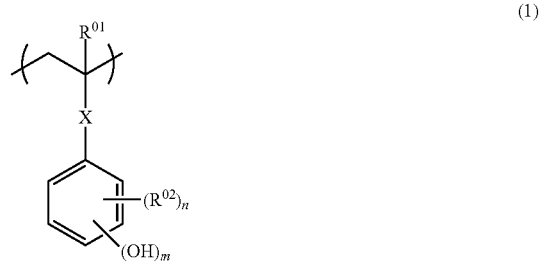

(1)

wherein $R^{01}$ represents a hydrogen atom or a methyl group, $R^{02}$ represents an alkyl group having 1 to 3 carbon atoms, "m" represents an integer of 1 or 2, "n" represents an integer of 0 to 4, m+n is an integer of 1 or more and 5 or less, and X represents a single bond or an alkylene group having 1 to 10 carbon atoms and optionally containing an oxygen atom,

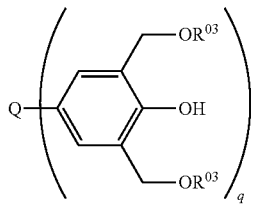

(2)

wherein Q represents a single bond or a hydrocarbon group with a valency of "q" having 1 to 20 carbon atoms, $R^{03}$ represents a hydrogen atom or a methyl group, and "q" represents an integer of 1 to 5.

Hereinafter, the present invention will be described in detail. However, the present invention is not limited thereto.

[Material for Forming Adhesive Film]

The present invention provides a material for forming an adhesive film that gives an adhesive film formed between a silicon-containing middle layer film and a resist upper layer film, the material for forming an adhesive film containing: (A) a resin having a structural unit shown by the following general formula (1); (B) a crosslinking agent containing one or more compounds shown by the following general formula (2); (C) a photo-acid generator; and (D) an organic solvent. Note that in the inventive material for forming an adhesive film, one kind of the resin (A) may be used, or two or more kinds thereof may be used in combination. Furthermore, the material for forming an adhesive film may contain components other than the components (A) to (D). In the following, each component will be described.

[(a) Resin]

The resin (A) contained in the inventive material for forming an adhesive film is shown by the following general formula (1).

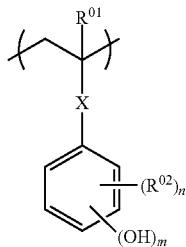

(1)

In the formula, $R^{01}$ represents a hydrogen atom or a methyl group, $R^{02}$ represents an alkyl group having 1 to 3 carbon atoms, "m" represents an integer of 1 or 2, "n" represents an integer of 0 to 4, m+n is an integer of 1 or more and 5 or less, and X represents a single bond or an alkylene group having 1 to 10 carbon atoms and optionally containing an oxygen atom.

In the general formula (1), $R^{01}$ represents a hydrogen atom or a methyl group, Ru represents an alkyl group having 1 to 3 carbon atoms, "m" represents an integer of 1 or 2, "n" represents an integer of 0 to 4, and m+n is an integer of 1 or more and 5 or less. Preferably, "m" represents an integer of 1 or 2, "n" represents an integer of 0 or 1, and m+n is an integer of 1 or more and 3 or less. Further preferably, "m" represents 1, "n" represents 0, and m+n is 1.

The X in the general formula (1) represents a single bond or an alkylene group having 1 to 10 carbon atoms and optionally containing an oxygen atom. The oxygen atom in the X can form a carbonyl group, a hydroxy group, or an ether bond. For example, the ether bond is an alkylene group having 1 carbon atom and containing an oxygen atom.

Specific examples of the X include the following, etc., but are not limited thereto.

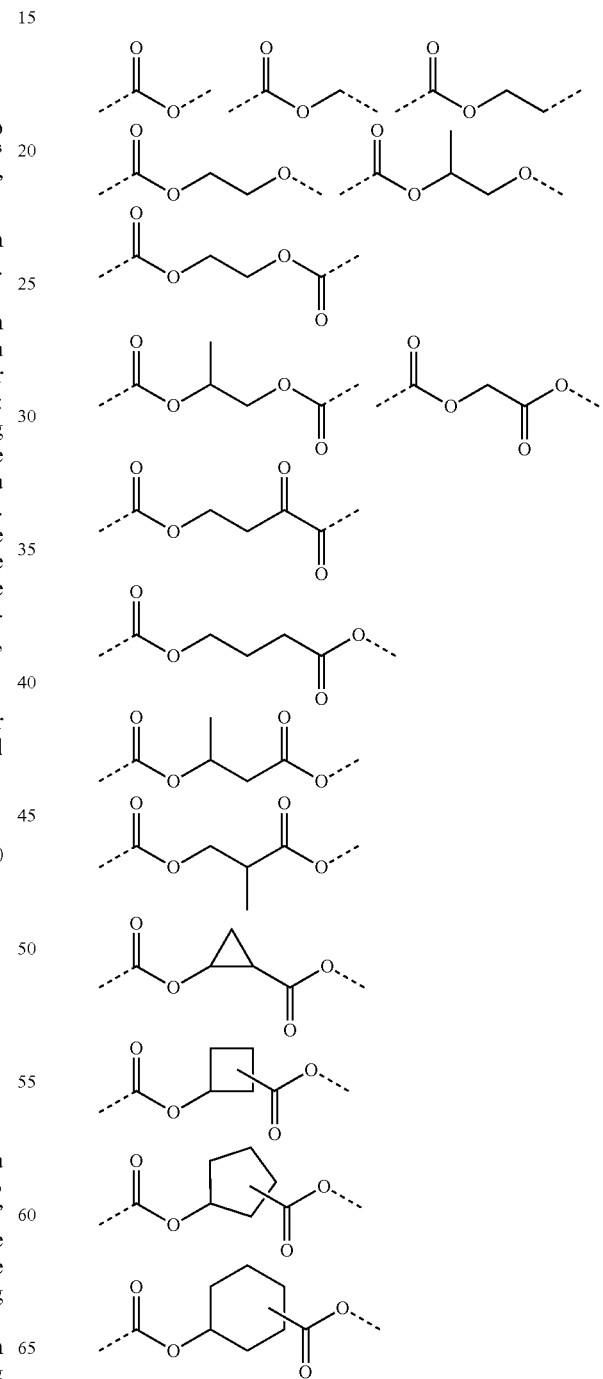

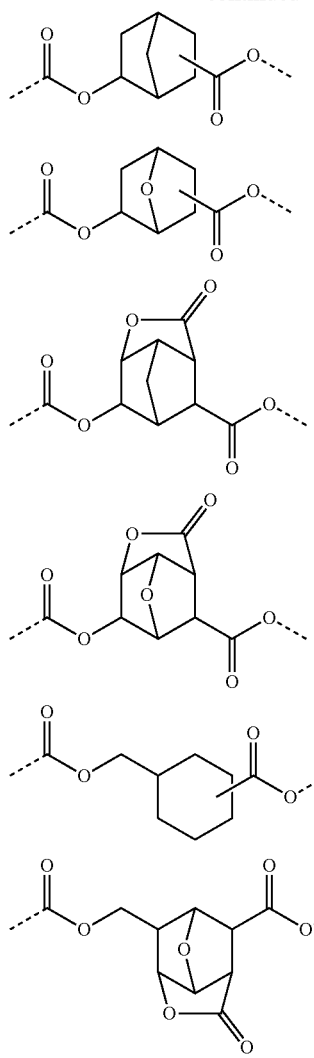

In the formulae, a broken line represents a bonding arm.

Examples of the $R^{02}$ in the general formula (1) include a methyl group, an ethyl group, a propyl group, and an isopropyl group, and in view of adhesiveness with the resist upper layer film, a methyl group is preferable.

Specific examples of the resin shown by the general formula (1) include the following, but are not limited thereto. In the following formulae, $R^{01}$ is as defined above.

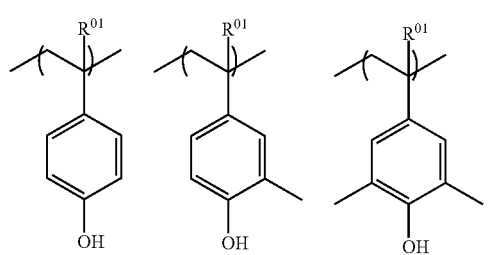

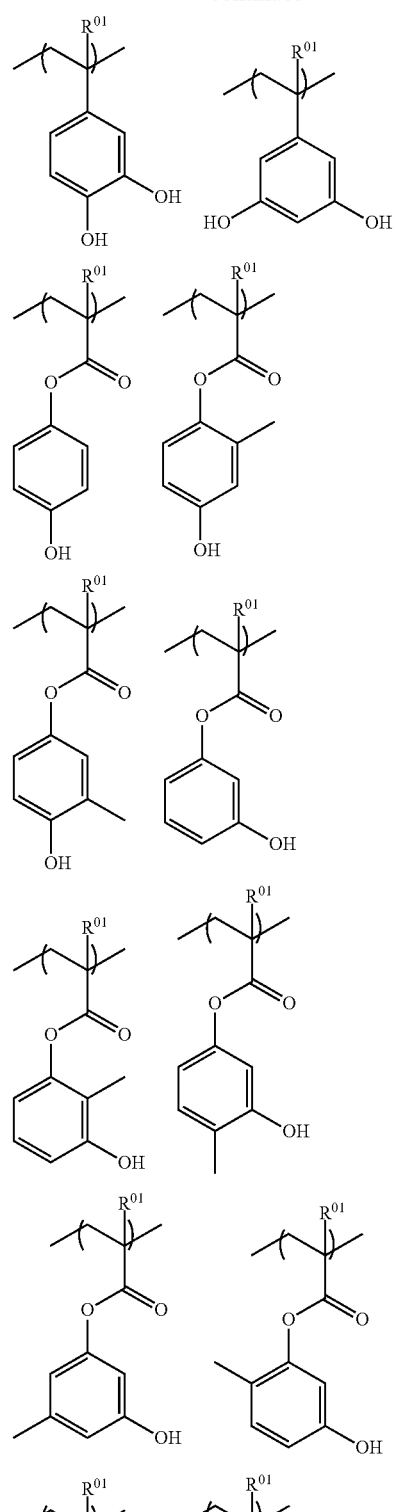

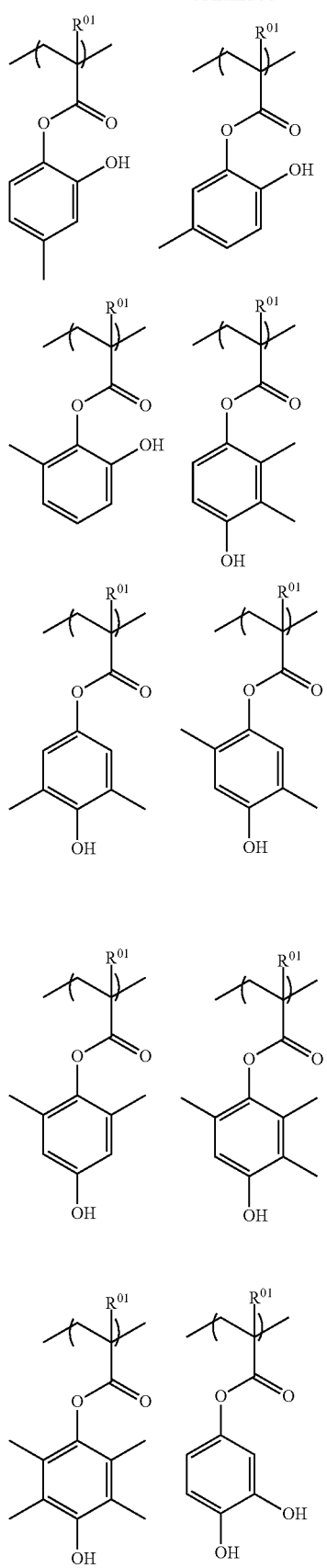
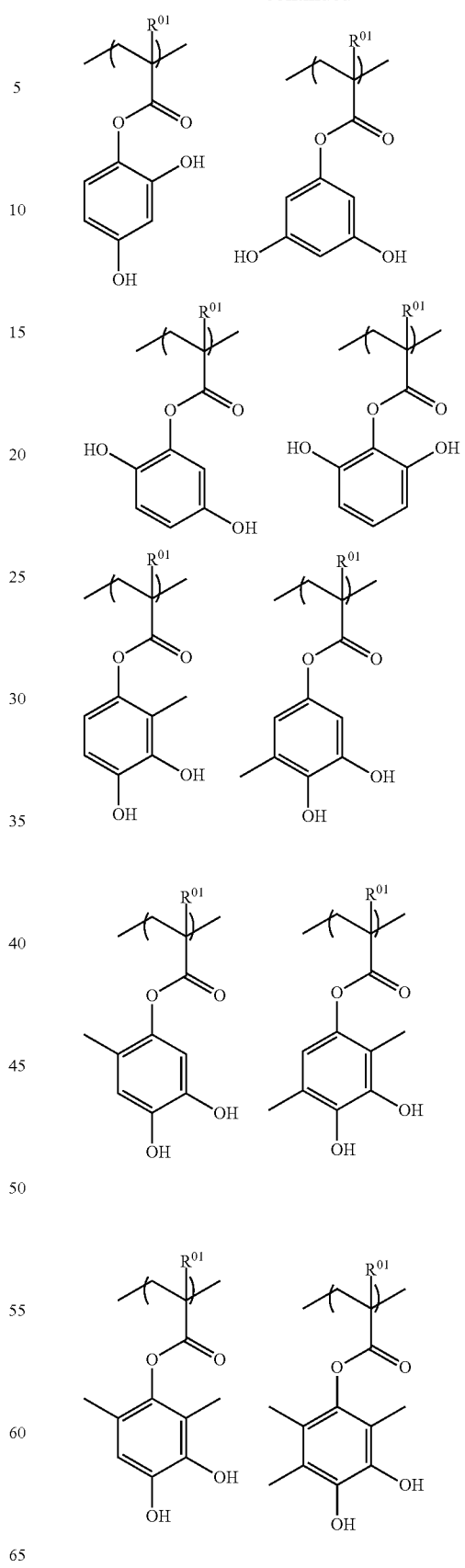

-continued
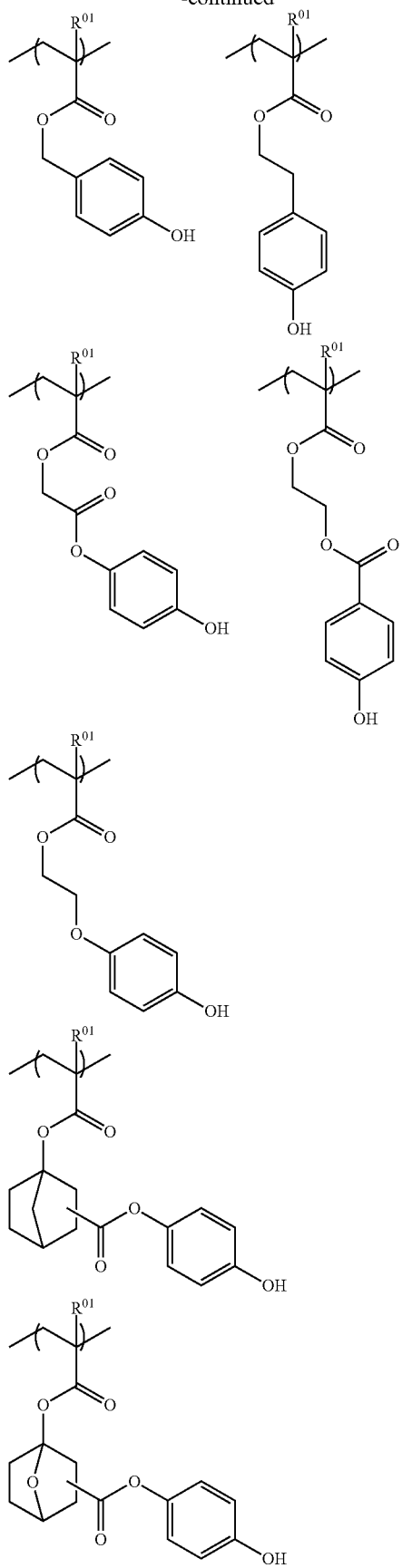
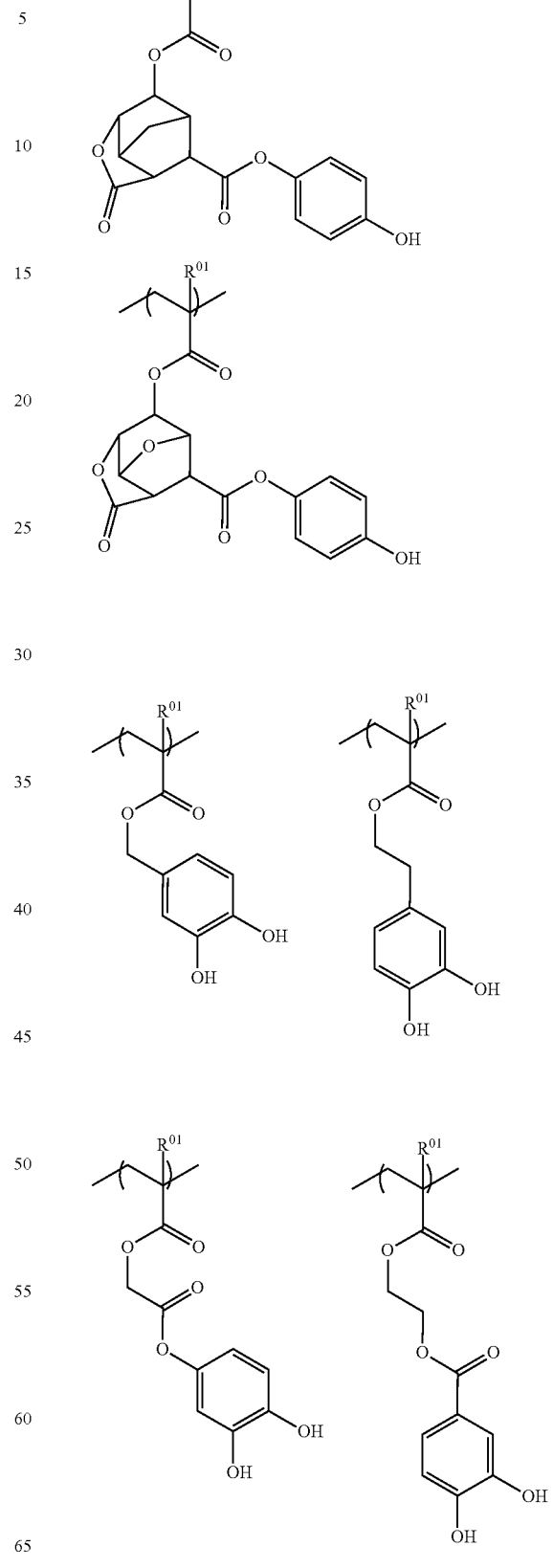

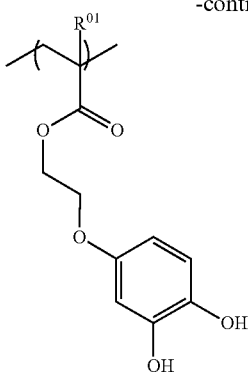

When the material for forming an adhesive film contains these resins, it is possible to form a material for forming an adhesive film having high adhesiveness to a resist upper layer film and having an effect of suppressing fine pattern collapse, and the material can be manufactured easily.

By using a material for forming an adhesive film containing such a resin for forming a multilayer resist film applied in fine processing in a manufacturing process of a semiconductor device or the like, it is possible to provide a material for forming an adhesive film that has high adhesiveness to a resist upper layer film and has an effect of suppressing fine pattern collapse, a method for forming an adhesive film, and a patterning process.

The resin can be synthesized according to a known method by polymerizing monomers protected with a protecting group as necessary, and then performing a deprotection reaction as necessary. The polymerization reaction is not particularly limited, but is preferably radical polymerization or anion polymerization. Regarding these methods, JP 2004-115630 A may be consulted.

The resin preferably has a weight-average molecular weight (Mw) of 1,000 to 20,000, more preferably 5,000 to 15,000. When the Mw is 1,000 or more, excellent film-formability can be provided, the generation of sublimation products during heat-curing can be suppressed, and the contamination of apparatuses due to sublimation products can be suppressed. Meanwhile, when the Mw is 20,000 or less, coatability failure or coating defects due to insufficient solubility to solvents can be suppressed. Furthermore, the resin preferably has a molecular weight distribution (Mw/Mn) of 1.0 to 2.8, more preferably 1.0 to 2.5. Note that in the present invention, Mw and molecular weight distribution are values measured in terms of polystyrene by gel permeation chromatography (GPO) using tetrahydrofuran (THF) as an eluent.

[(B) Crosslinking Agent]

The inventive material for forming an adhesive film contains a crosslinking agent shown by the following general formula (2) as the component (B). In this manner, curability is enhanced, and intermixing with a resist upper layer film is suppressed. In addition to this advantageous effect, film thickness uniformity is also enhanced in some cases. Furthermore, when a crosslinking agent shown by the following general formula (2) is used, crosslinking rate is higher compared with other crosslinking agents, so that sufficient curability can be achieved even when no thermal acid generator is contained. Accordingly, the inventive material for forming an adhesive film does not require a thermal acid generator, and preferably does not contain a thermal acid generator.

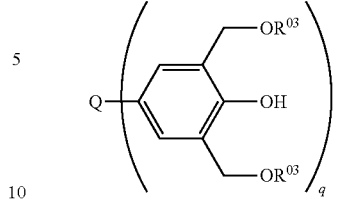

In the formula, Q represents a single bond or a hydrocarbon group with a valency of "q" having 1 to 20 carbon atoms, $R^{03}$ represents a hydrogen atom or a methyl group, and "q" represents an integer of 1 to 5.

The Q in the general formula (2) represents a single bond or a hydrocarbon group with a valency of "q" having 1 to 20 carbon atoms. "q" represents an integer of 1 to 5, more preferably 2 or 3. When Q is a hydrocarbon group with a valency of "q" having 1 to 20 carbon atoms, Q is a hydrocarbon group with a valency of "q" obtained by removing "q" hydrogen atoms from a hydrocarbon having 1 to 20 carbon atoms. More specific examples of the hydrocarbon having 1 to 20 carbon atoms in this case include methane, ethane, propane, butane, isobutane, pentane, cyclopentane, hexane, cyclohexane, methyl pentane, methyl cyclohexane, dimethyl cyclohexane, trimethyl cyclohexane, benzene, toluene, xylene, ethyl benzene, ethyl isopropylbenzene, diisopropylbenzene, methylnaphthalene, ethyl naphthalene, and eicosane.

The $R^{03}$ in the general formula (2) represents a hydrogen atom or a methyl group, preferably a methyl group.

Specific examples of compounds shown by the general formula (2) include the following compounds, but are not limited thereto. In the following formulae, $R^{03}$ is as defined above.

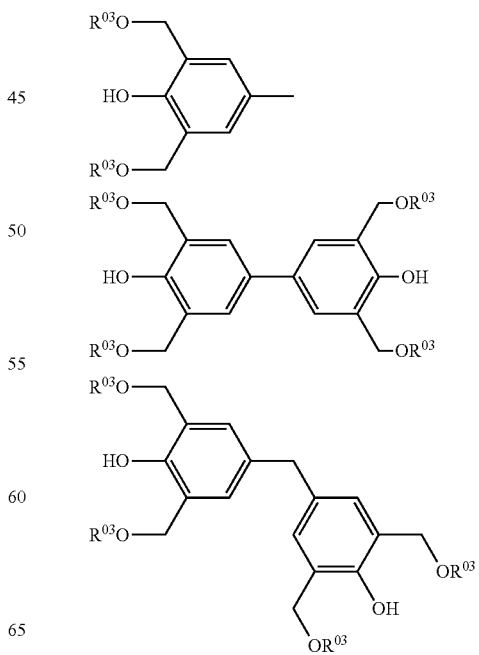

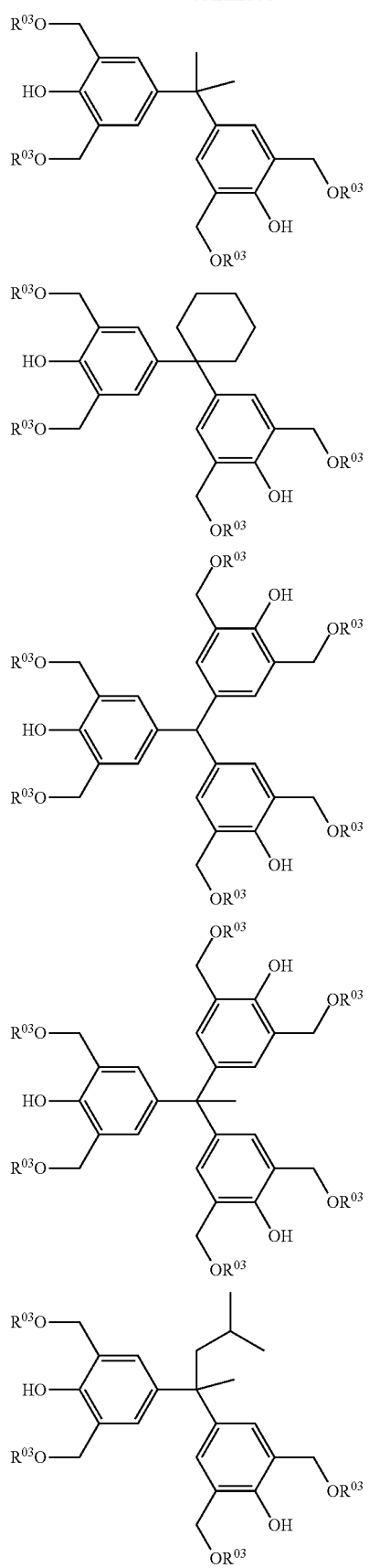
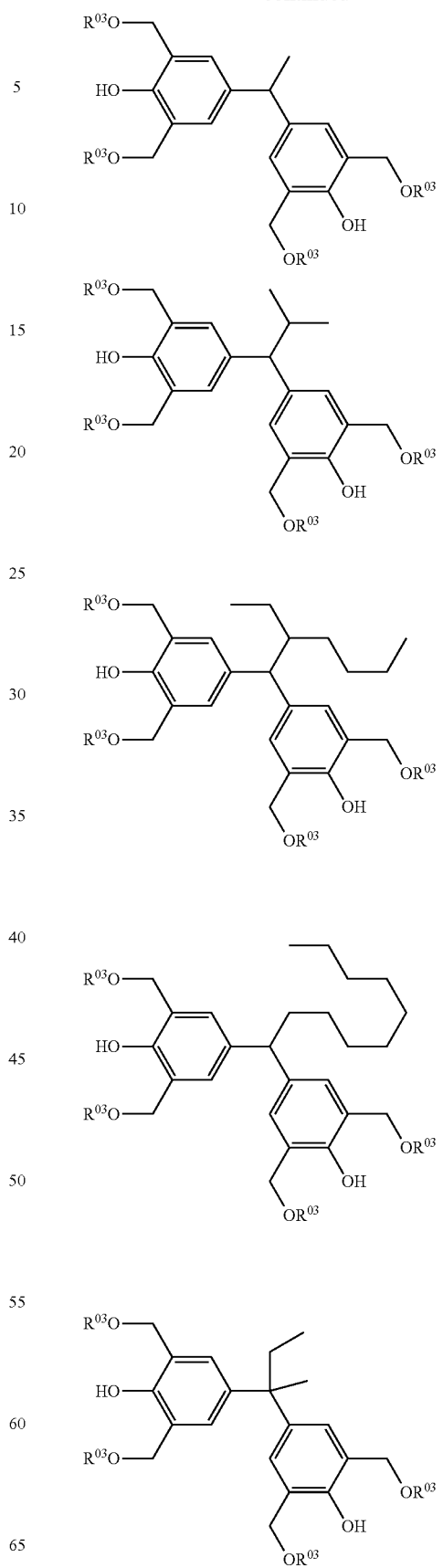

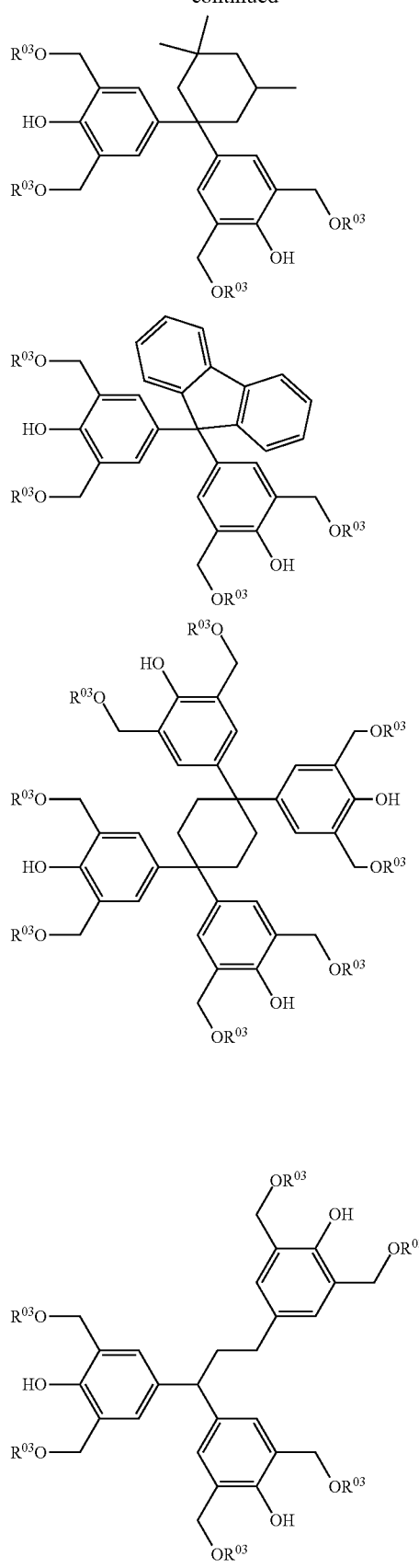
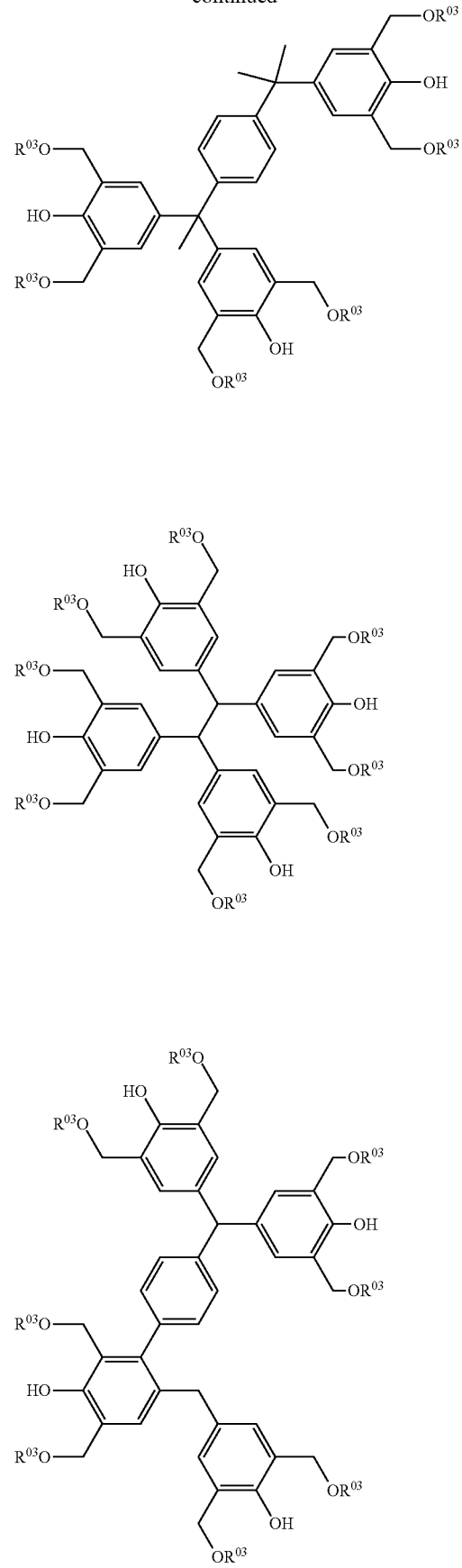

-continued

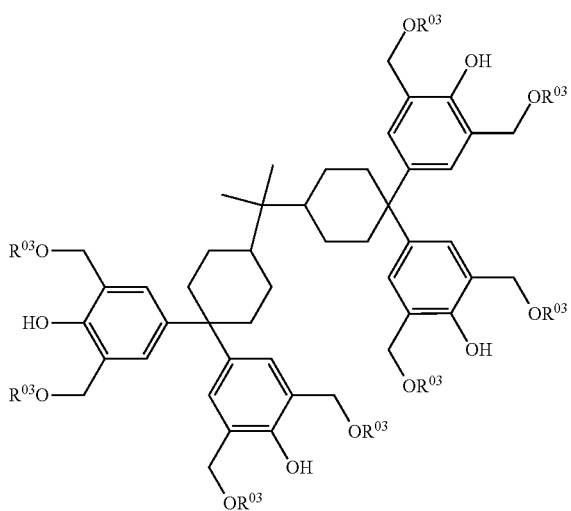

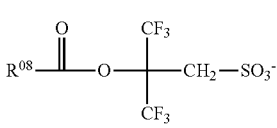

(5)

In the formulae, $R^{07}$ and $R^{08}$ each independently represent a monovalent hydrocarbon group containing an aliphatic ring structure having 3 to 40 carbon atoms, optionally substituted with a heteroatom, and optionally having an intervening heteroatom.

In this event, the general formula (4) is more preferably shown by the following general formula (4').

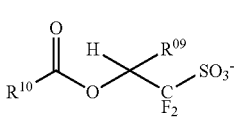

(4')

In the formula, $R^{09}$ represents a hydrogen atom or a trifluoromethyl group, and $R^{10}$ represents a monovalent hydrocarbon group containing an aliphatic ring structure having 3 to 30 carbon atoms, optionally substituted with a heteroatom, and optionally having an intervening heteroatom.

The $R^{04}$, $R^{05}$, and $R^{06}$ in the general formula (3) each independently represent a linear alkyl group or alkenyl group having 1 to 10 carbon atoms or a branched or cyclic alkyl group or alkenyl group having 3 to 10 carbon atoms, optionally substituted with a heteroatom, and optionally having an intervening heteroatom, or represent an aryl group or aralkyl group having 6 to 18 carbon atoms, optionally substituted with a heteroatom, and optionally having an intervening heteroatom. Specific examples thereof include alkyl groups such as a methyl group, an ethyl group, an n-propyl group, an isopropyl group, an n-butyl group, a tert-butyl group, a cyclopropyl group, a cyclopentyl group, a cyclohexyl group, a cyclopropylmethyl group, a 4-methylcyclohexyl group, a cyclohexylmethyl group, a norbornyl group, and an adamantyl group; alkenyl groups such as a vinyl group, an allyl group, a propenyl group, a butenyl group, a hexenyl group, and a cyclohexenyl group; aryl groups such as a phenyl group, a naphthyl group, and a thienyl group; aralkyl groups such as a benzyl group, a 1-phenylethyl group, and a 2-phenylethyl group; etc. Aryl groups are preferable. Additionally, some of the hydrogen atoms of these groups may be substituted with a heteroatom such as an oxygen atom, a sulfur atom, a nitrogen atom, and a halogen atom. A heteroatom such as an oxygen atom, a sulfur atom, and a nitrogen atom may be contained. As a result, a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like may be formed or contained. In addition, any two of $R^{04}$, $R^{05}$, and $R^{06}$ are optionally bonded with each other to form a ring with the sulfur atom in the formula.

Meanwhile, the $Y^-$ in the general formula (3) represents one of the general formulae (4) and (5), and specific examples thereof include the following or the like, but are not limited thereto. In the general formula (4) or (5), $R^{07}$ and $R^{08}$ each independently represent a monovalent hydrocarbon group containing an aliphatic ring structure having 3 to 40

One kind of the crosslinking agent (B) may be used, or two or more kinds thereof may be used in combination. The amount of the crosslinking agent (B) to be contained is preferably 10 mass % to 50 mass %, more preferably 15 mass % to 30 mass % based on a contained amount (100 mass %) of the resin (A). When the contained amount is 10 mass % or more, sufficient curability can be provided, and intermixing with a resist upper layer film can be suppressed. Meanwhile, when the contained amount is 50 mass % or less, the proportion of the resin (A) in the composition is low, so that there is no risk of the adhesiveness being degraded.

[(C) Photo-Acid Generator]

In addition, the inventive material for forming an adhesive film contains a photo-acid generator as the component (C). The photo-acid generator is preferably shown by the following general formula (3).

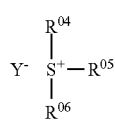

(3)

In the formula, $R^{04}$, $R^{05}$, and $R^{06}$ each independently represent a linear alkyl group or alkenyl group having 1 to 10 carbon atoms or a branched or cyclic alkyl group or alkenyl group having 3 to 10 carbon atoms, optionally substituted with a heteroatom, and optionally having an intervening heteroatom, or, represent an aryl group or aralkyl group having 6 to 18 carbon atoms, optionally substituted with a heteroatom, and optionally having an intervening heteroatom. Here, any two of $R^{04}$, $R^{05}$, and $R^{06}$ are optionally bonded with each other to form a ring with the sulfur atom in the formula, and $Y^-$ represents one of the following general formulae (4) and (5).

(4)

carbon atoms, optionally substituted with a heteroatom, and optionally having an intervening heteroatom. $R^{07}$ and $R^{08}$ preferably represent a 1-norbornyl group, a 1-adamantyl group, a 2-adamantyl group, or a 4-oxo-1-adamantyl group.
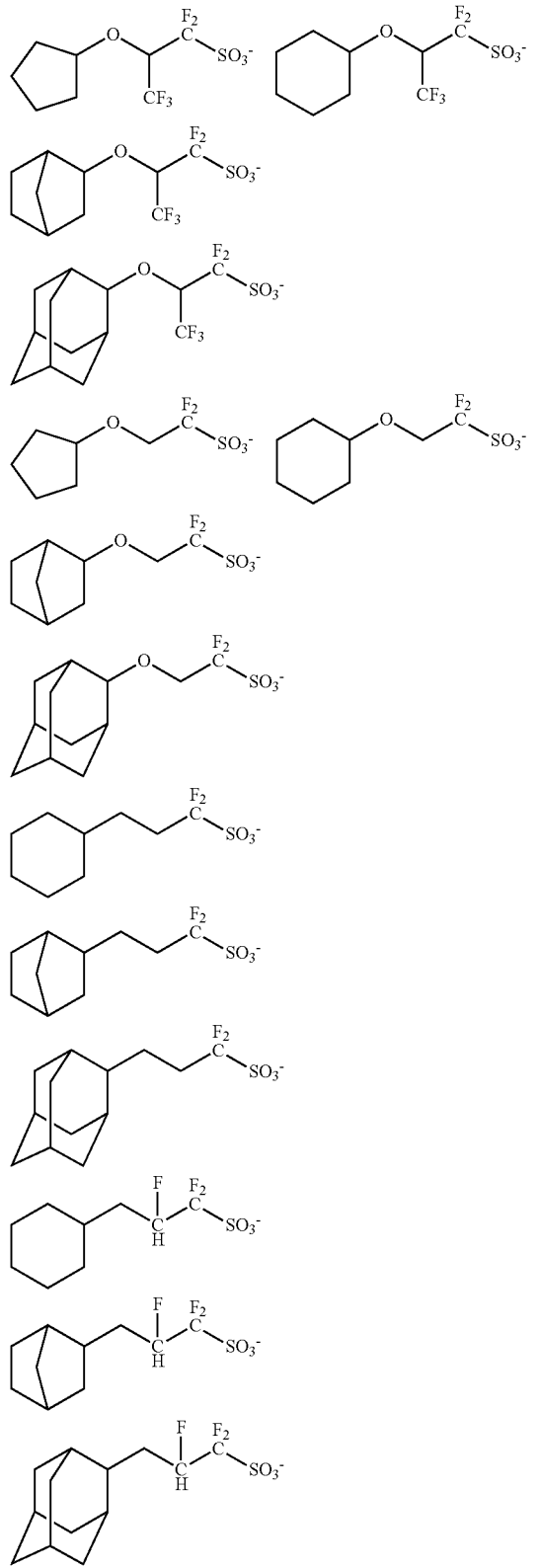
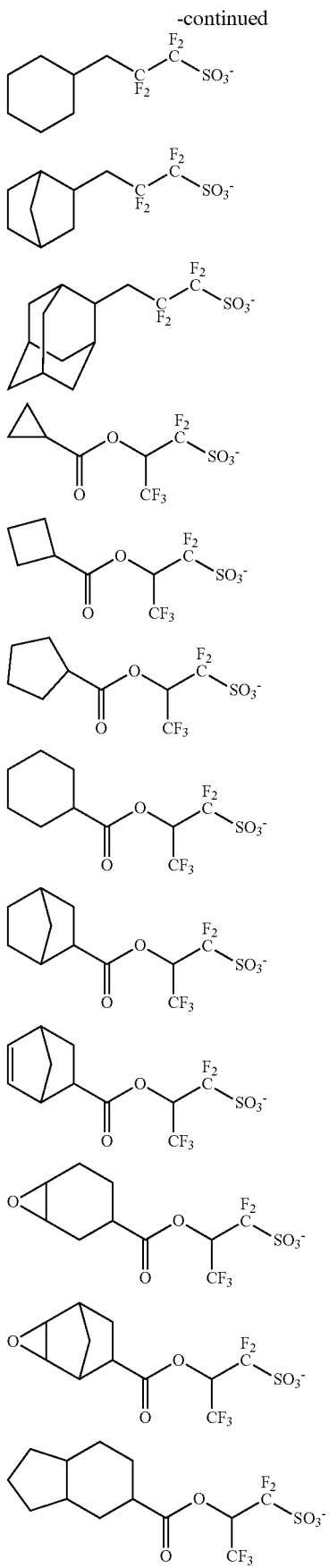

-continued
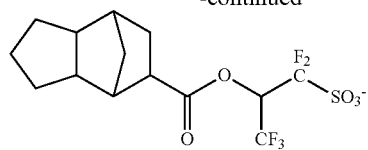
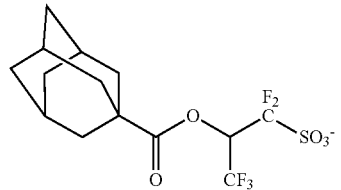
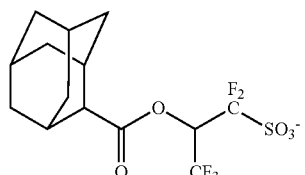
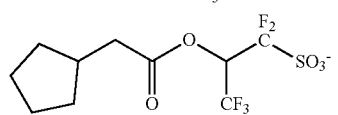
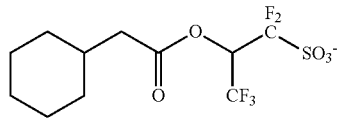
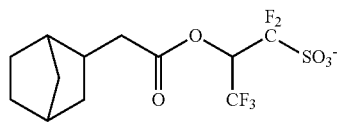
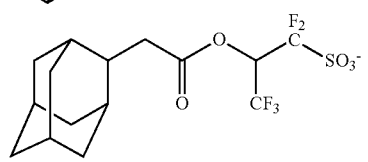
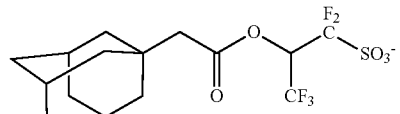
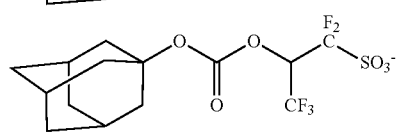
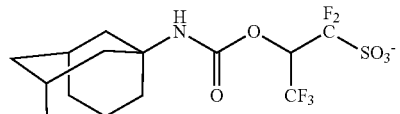
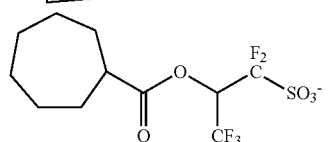
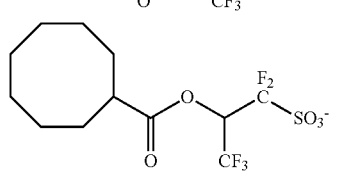
-continued
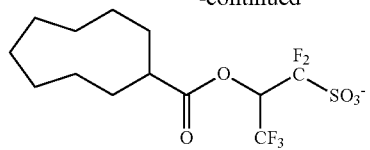
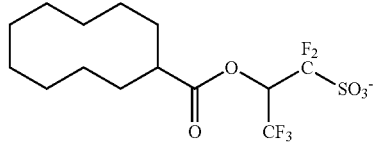
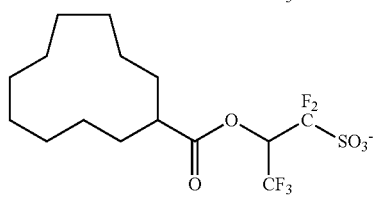
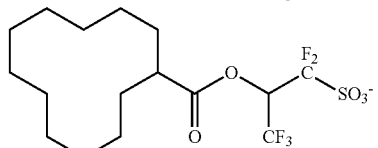
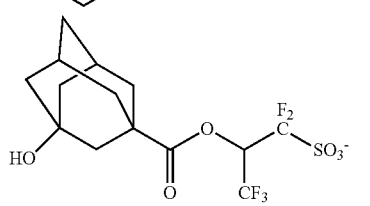
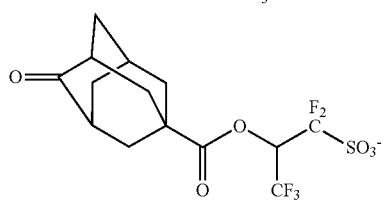
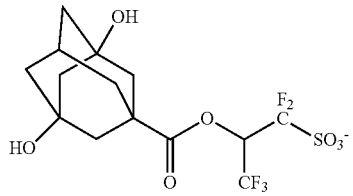
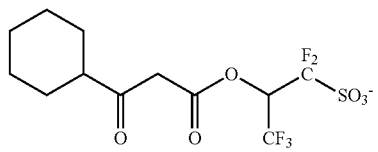
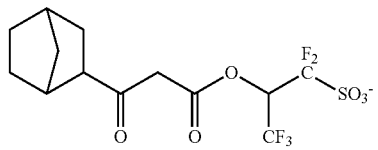
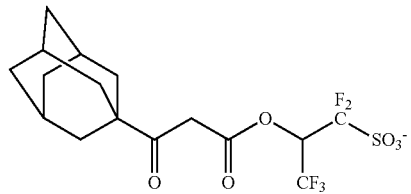

-continued
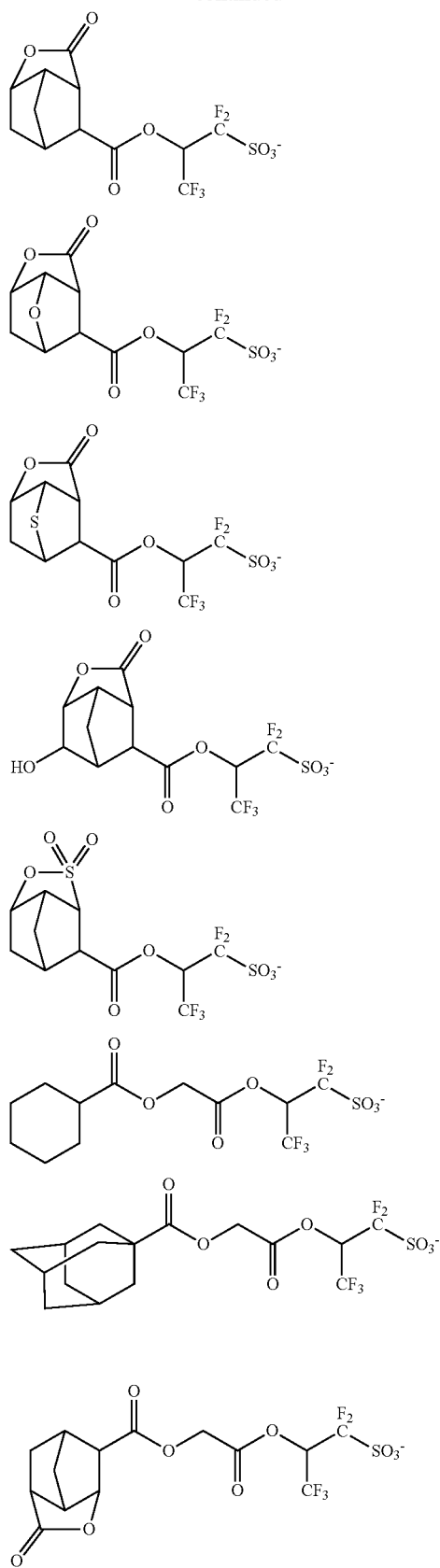
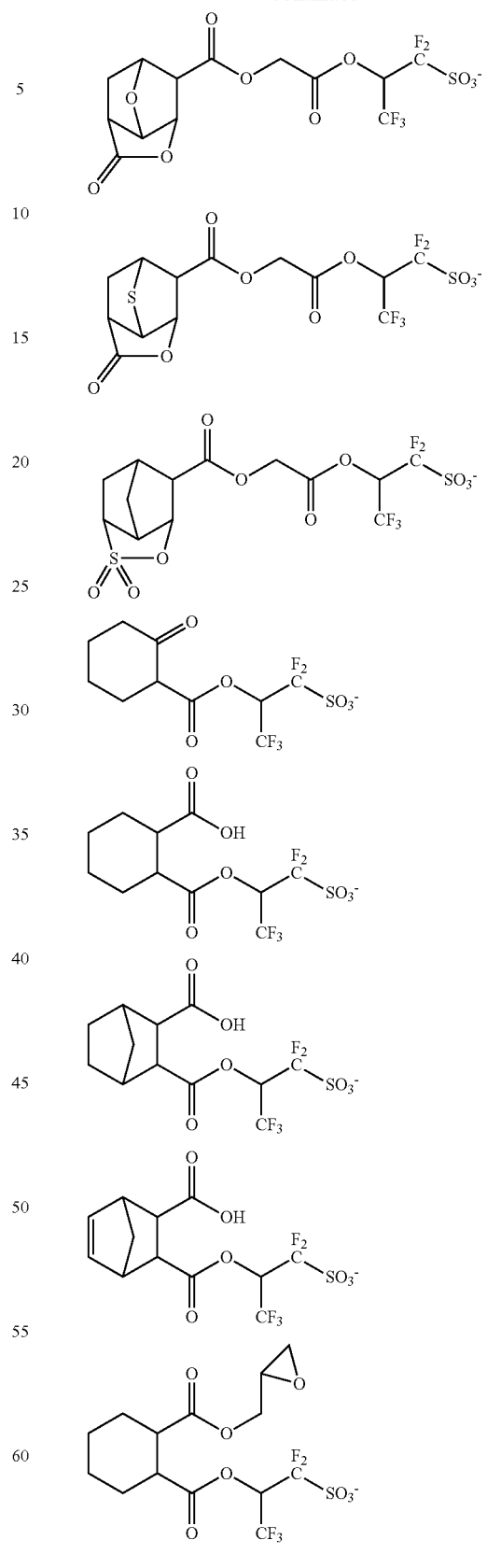

-continued
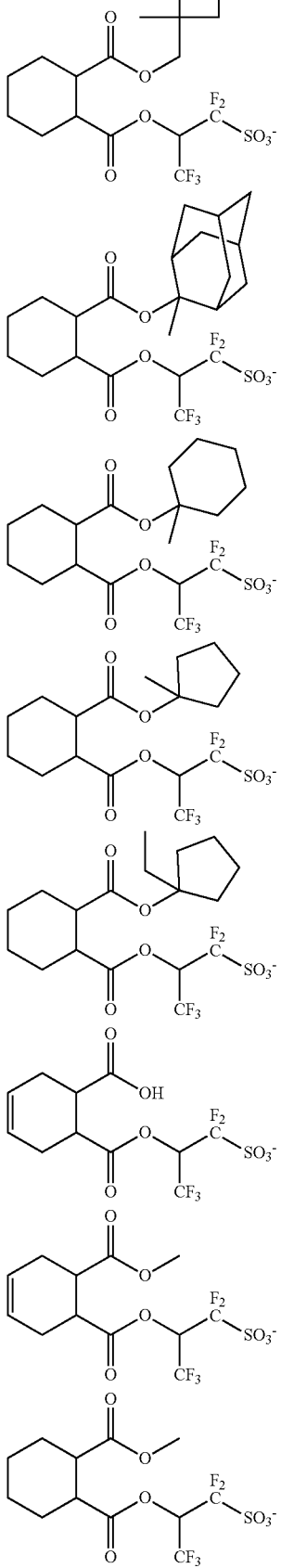
-continued
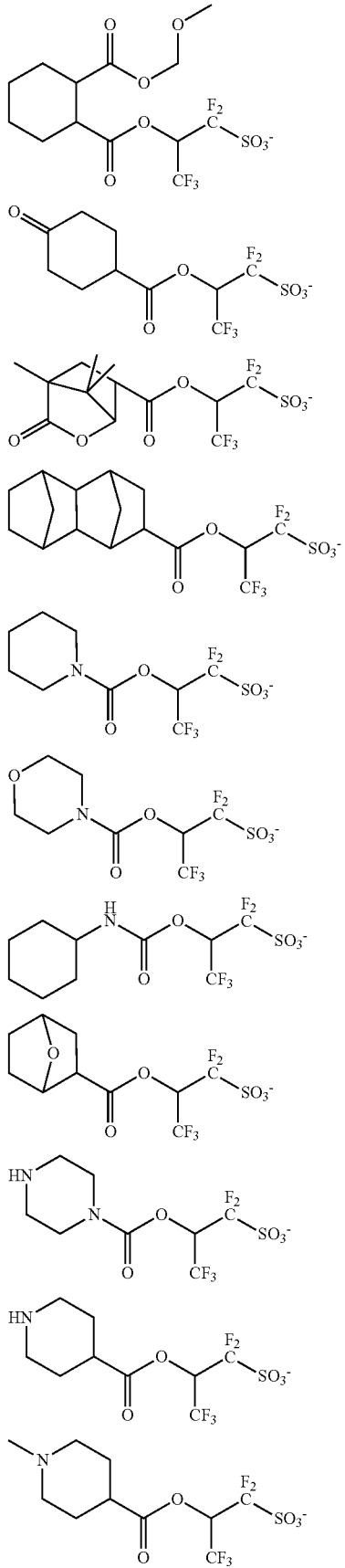

-continued
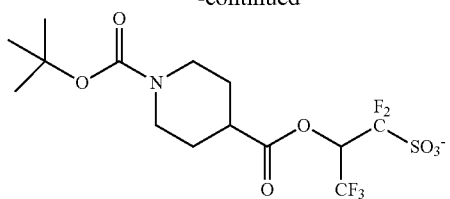
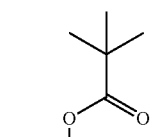
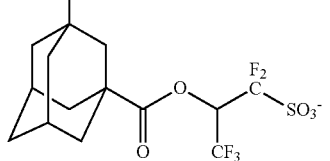
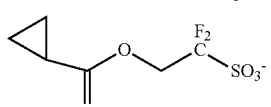
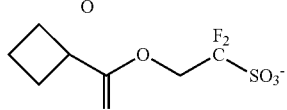
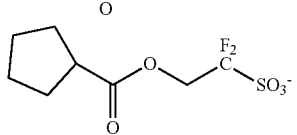
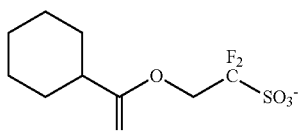
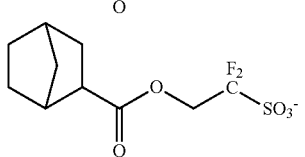
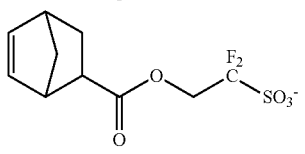
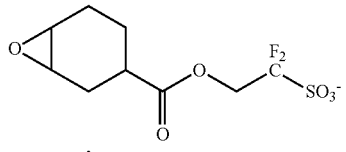
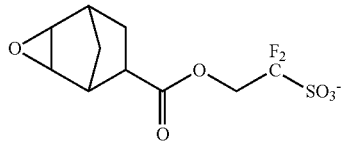
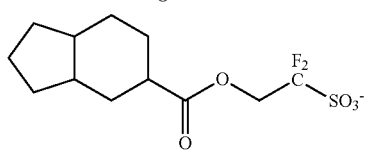
-continued
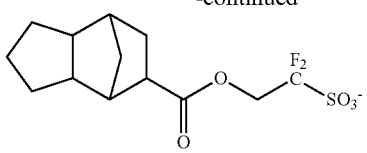
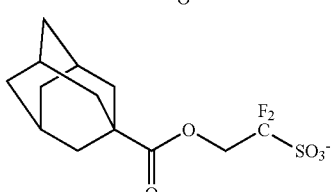
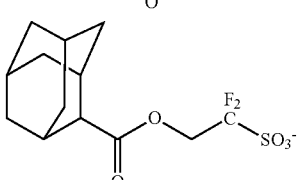
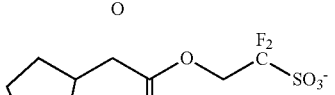
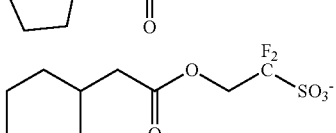
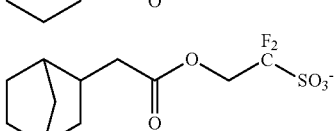
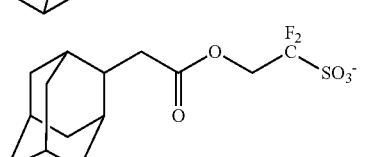
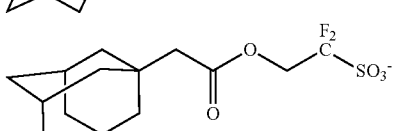
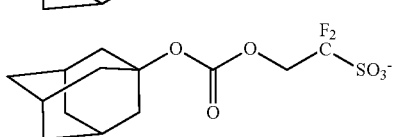
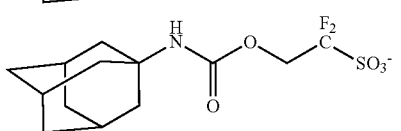
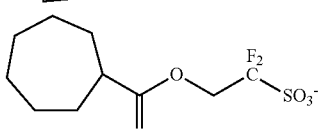
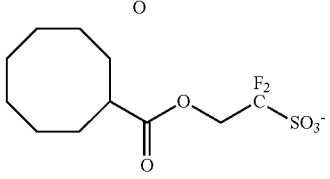

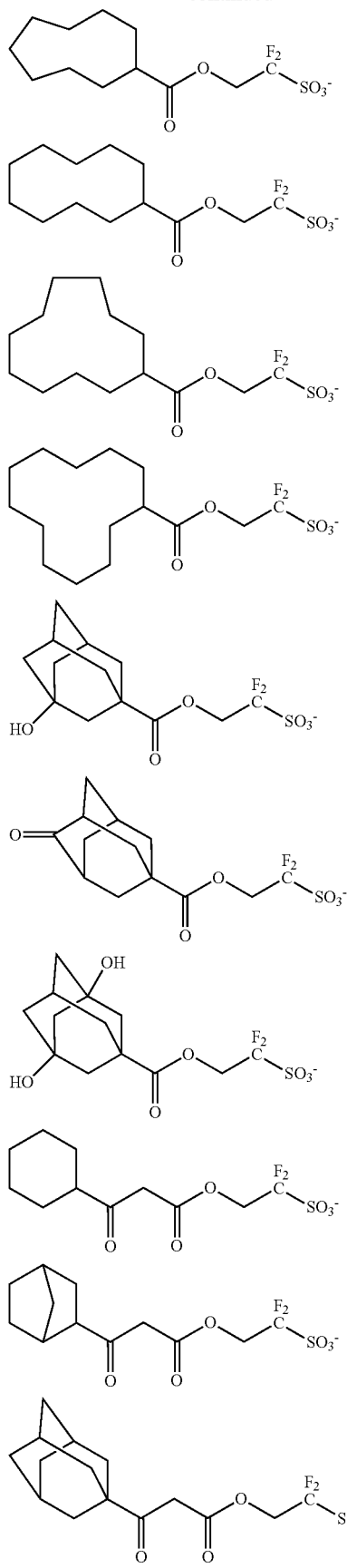
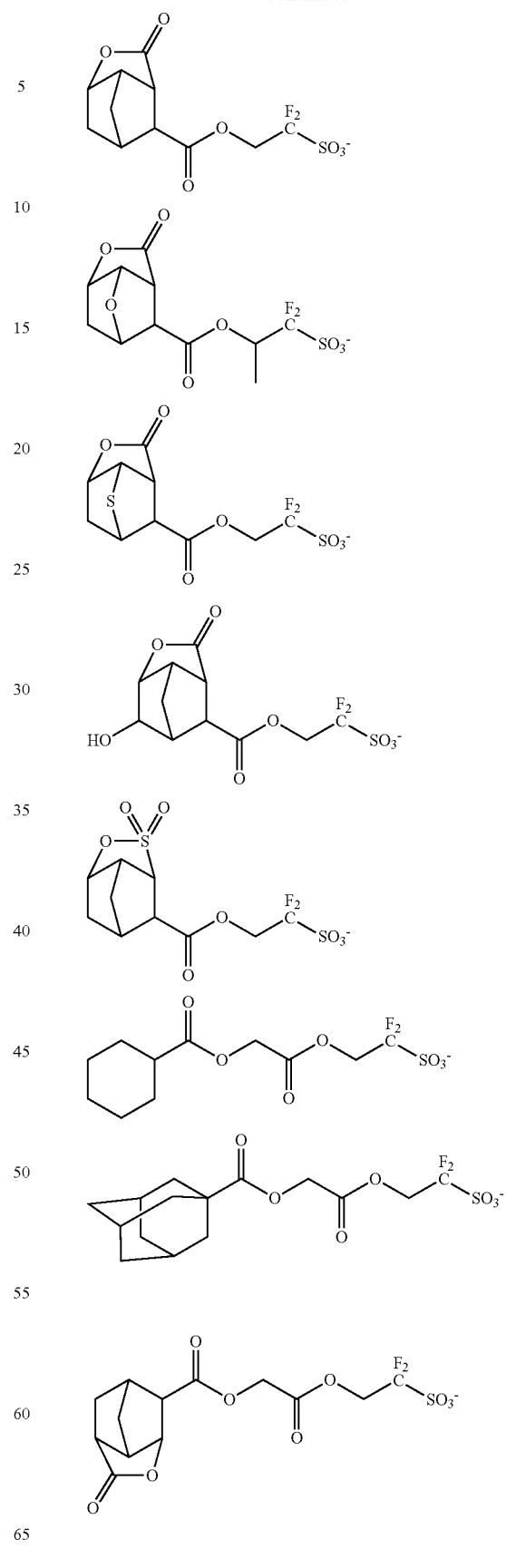

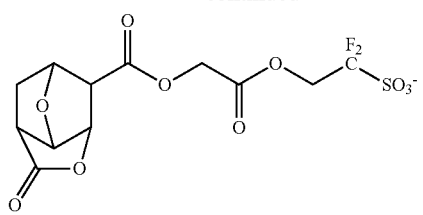
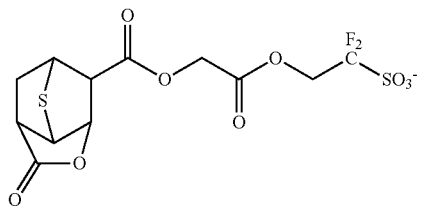
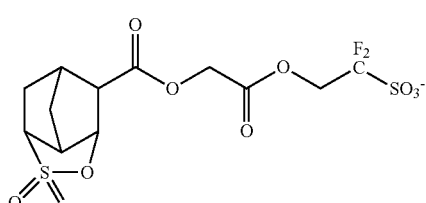
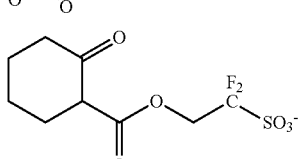
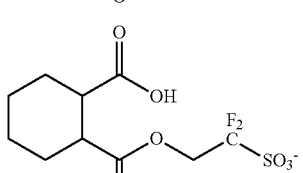
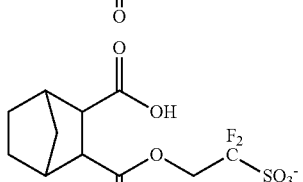
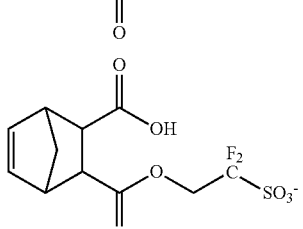
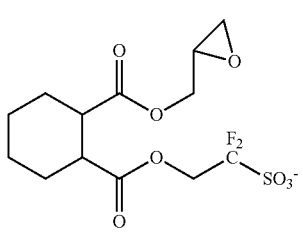
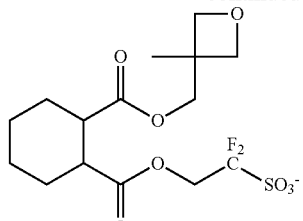
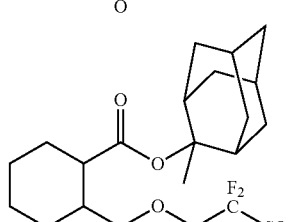
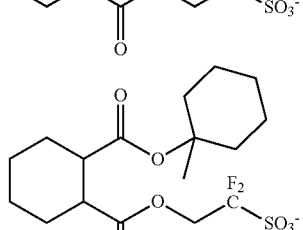
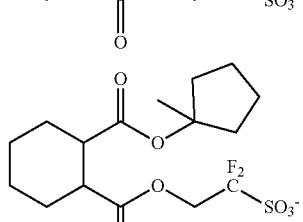
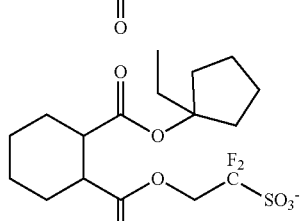
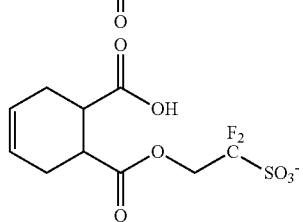
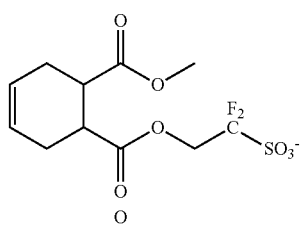
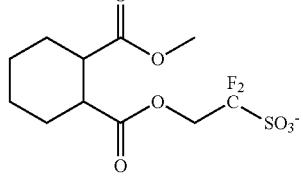

39
-continued
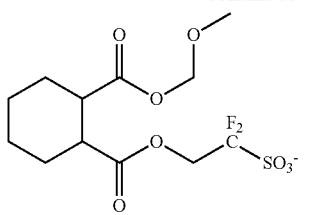
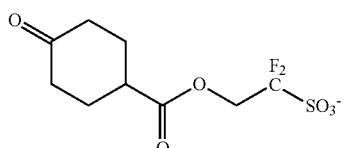
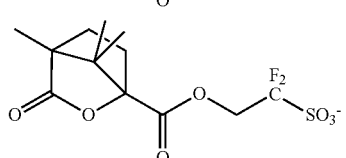
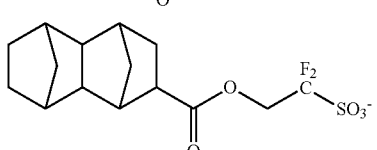
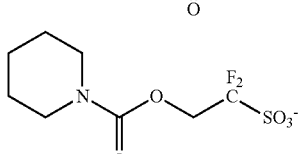
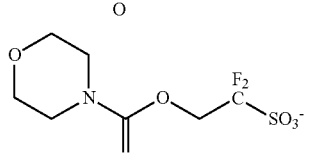
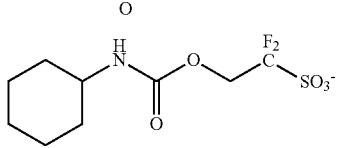
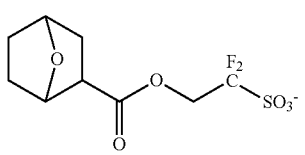
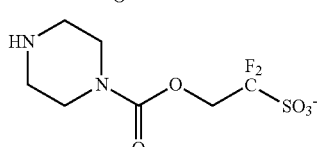
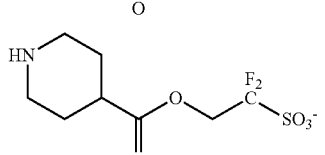
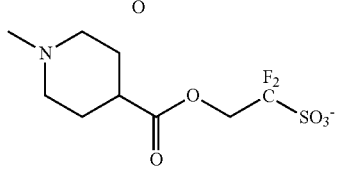
40
-continued
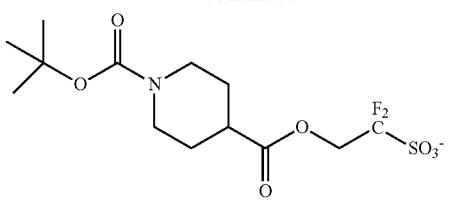
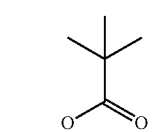
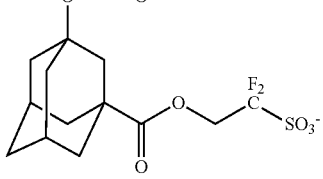
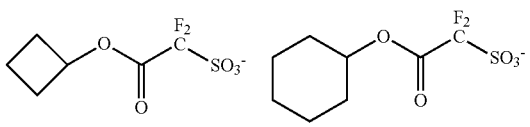
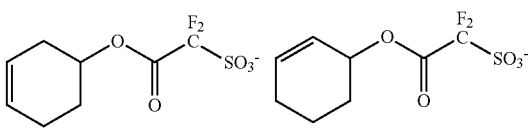
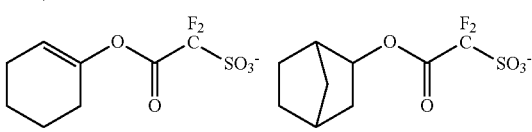
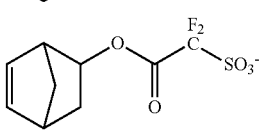
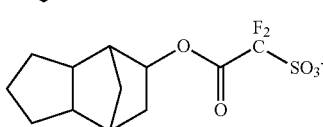
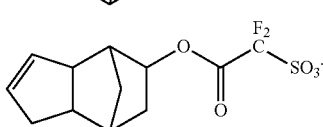
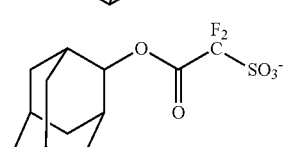
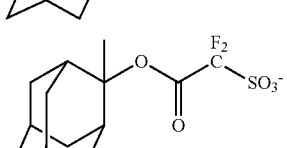
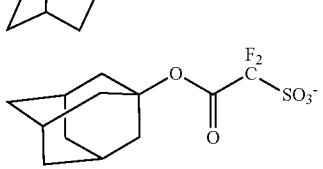

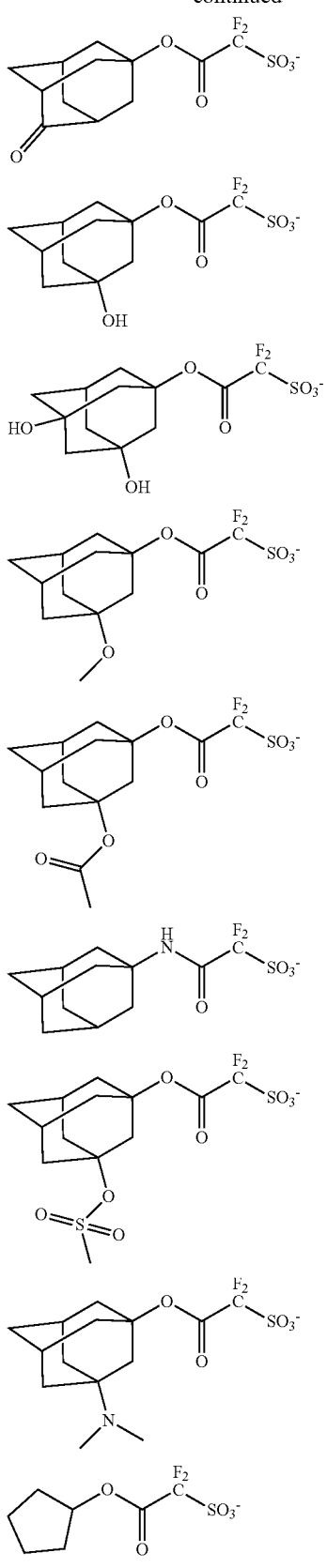
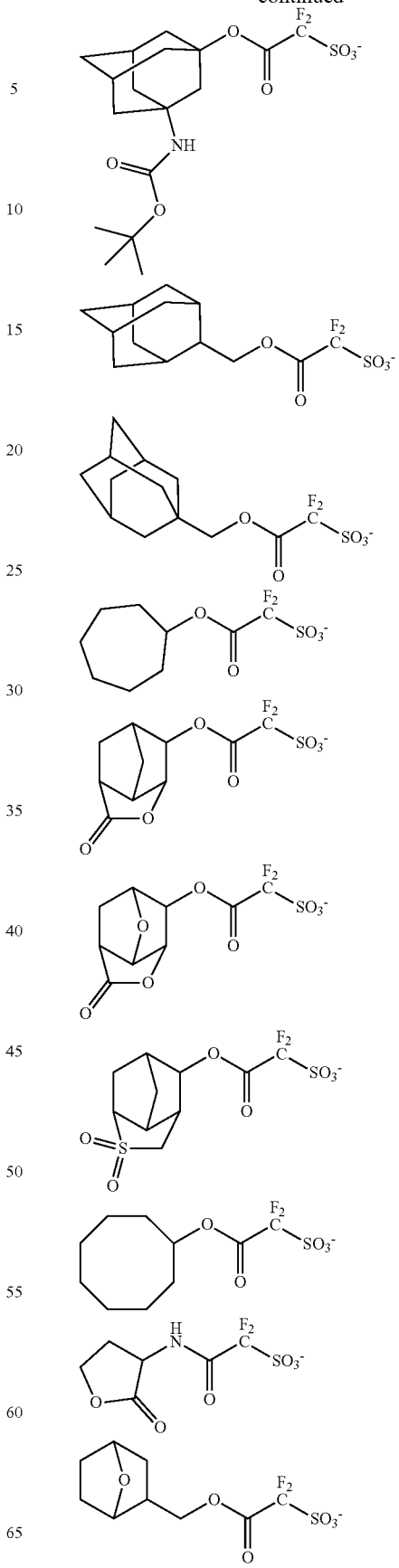

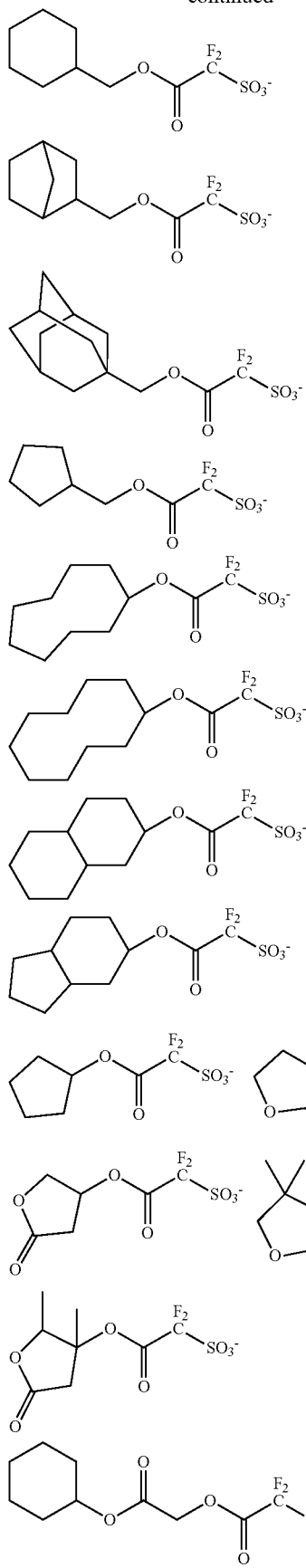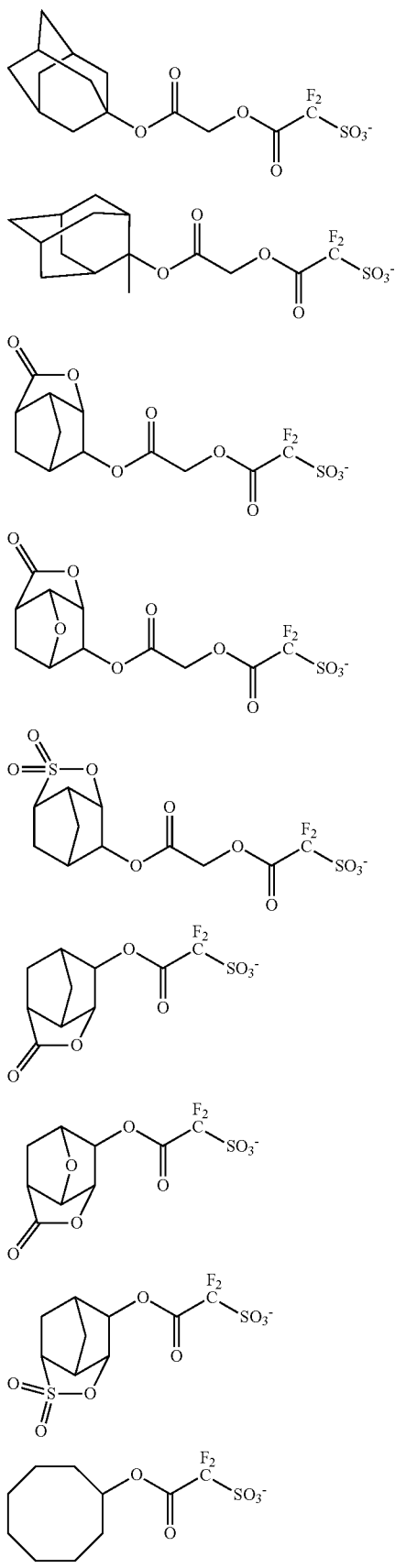

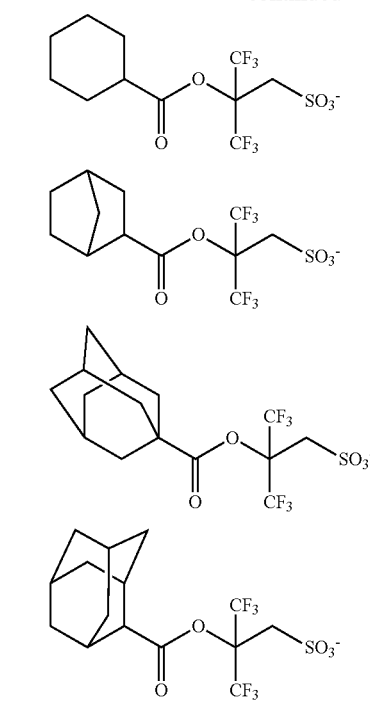
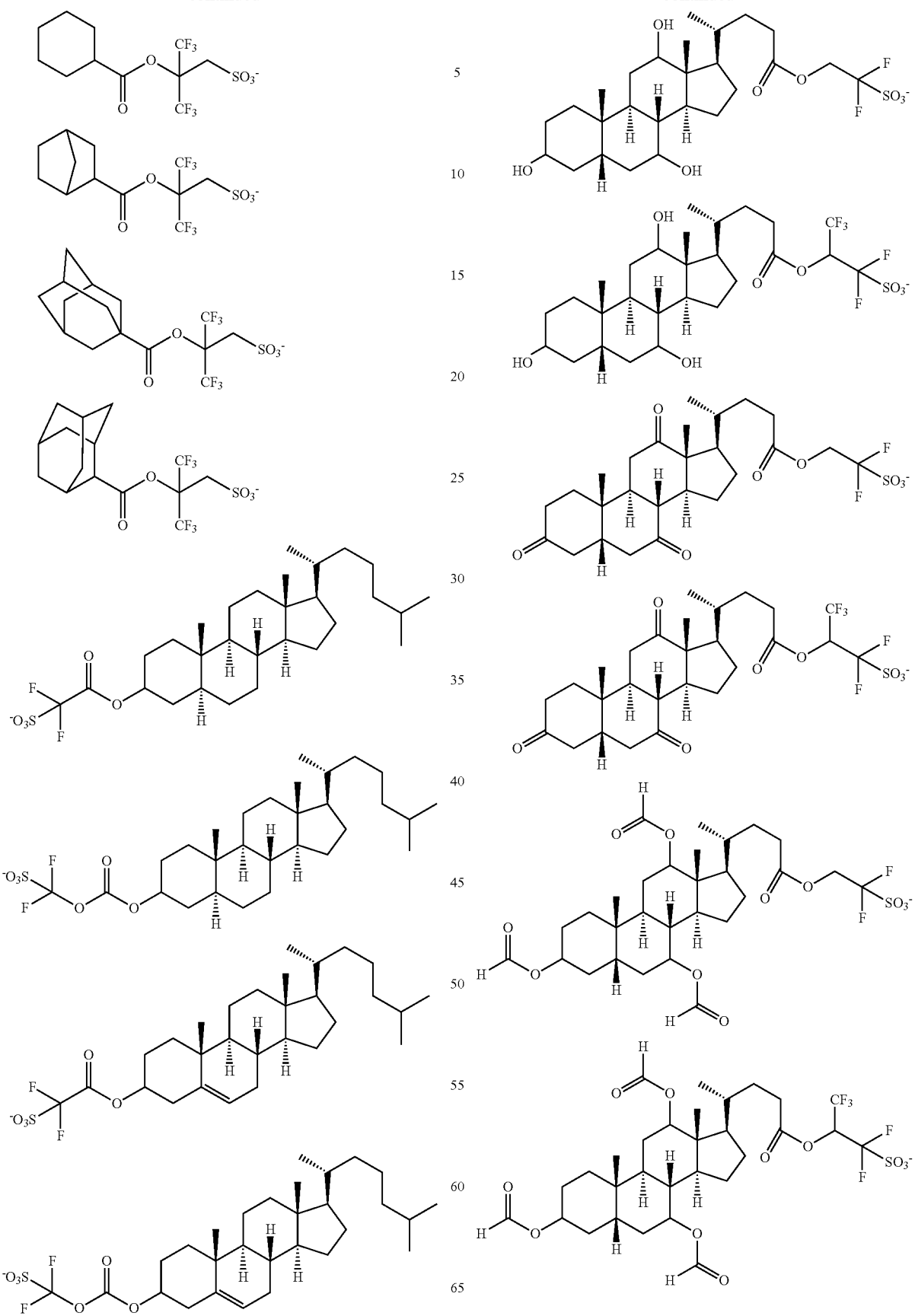

47
-continued
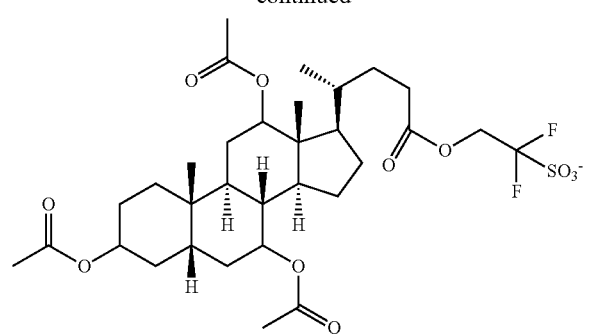
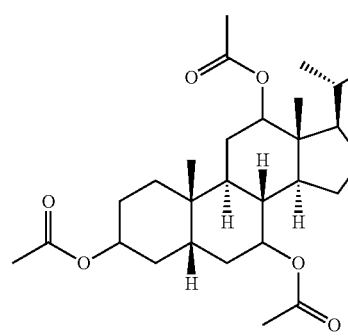
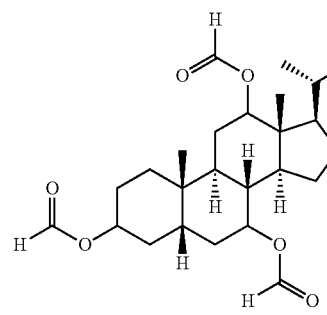
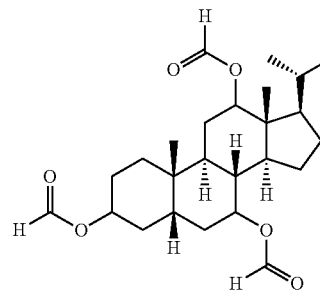
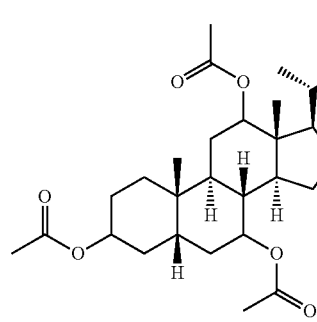
48
-continued
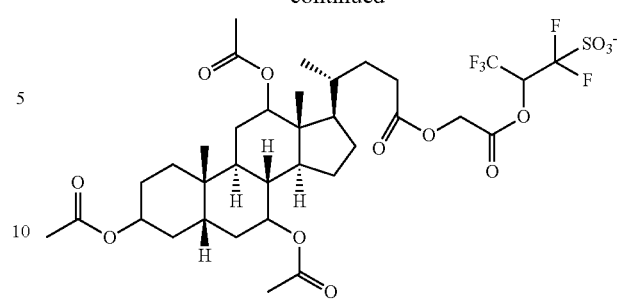
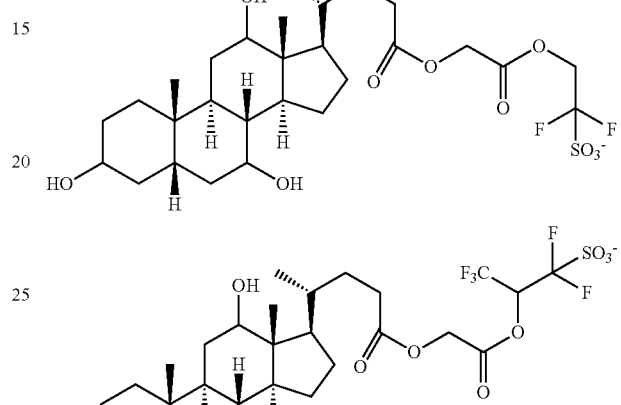
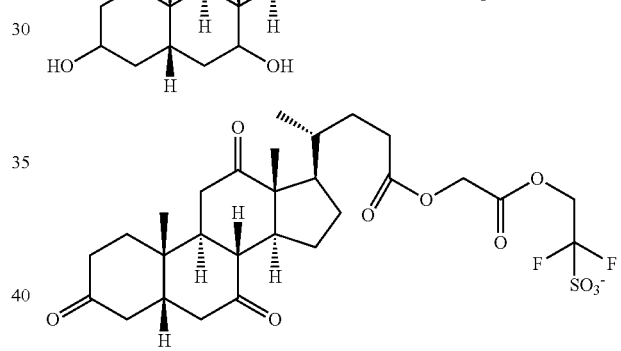
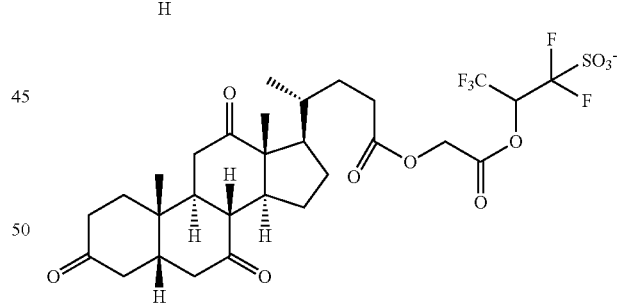
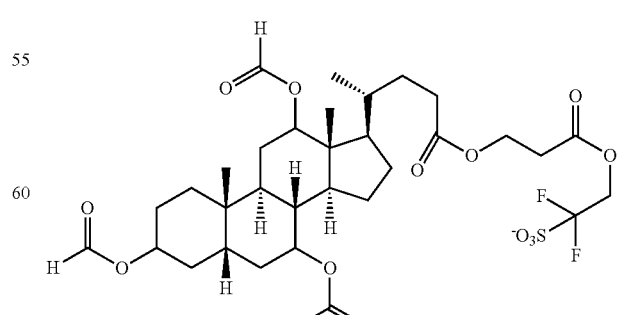

49
-continued
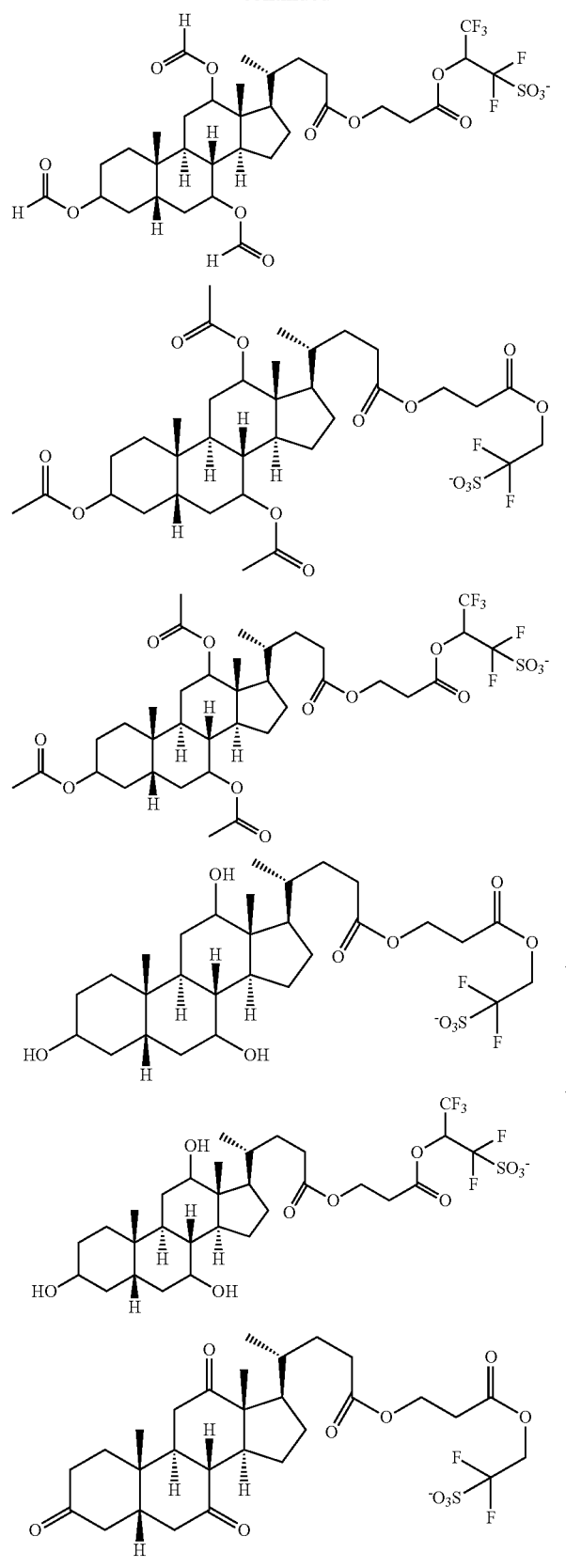
50
-continued
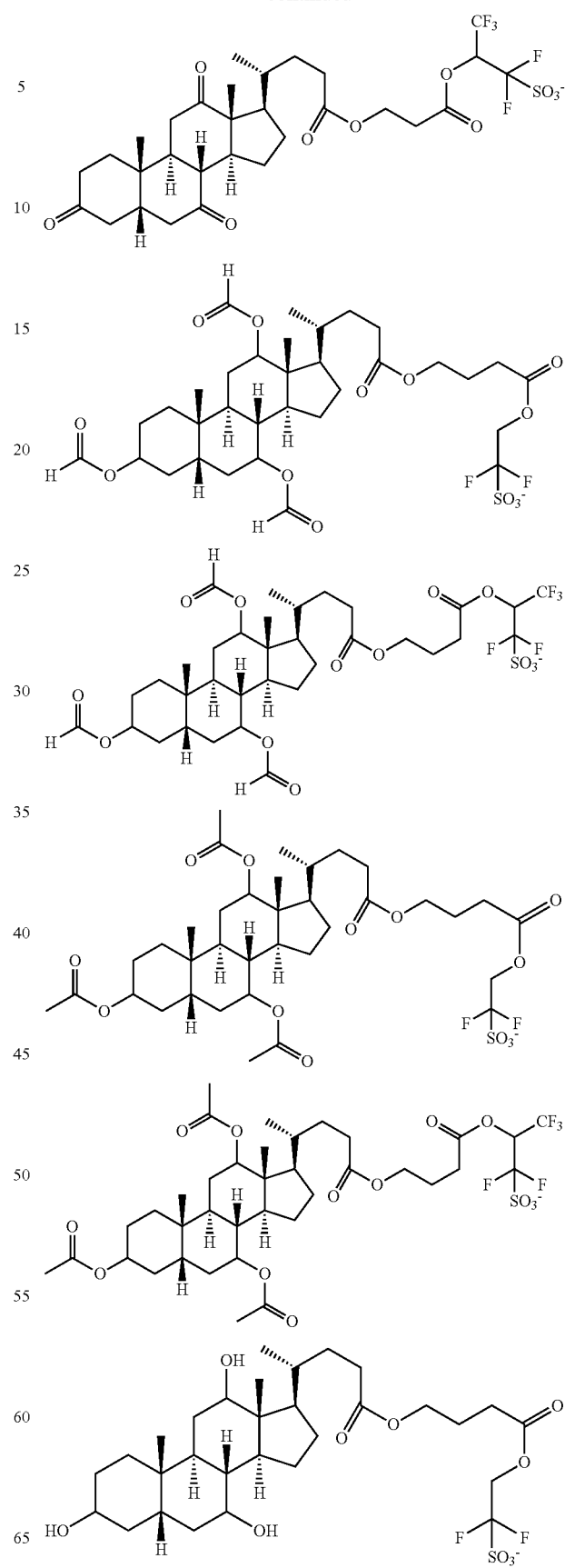

-continued

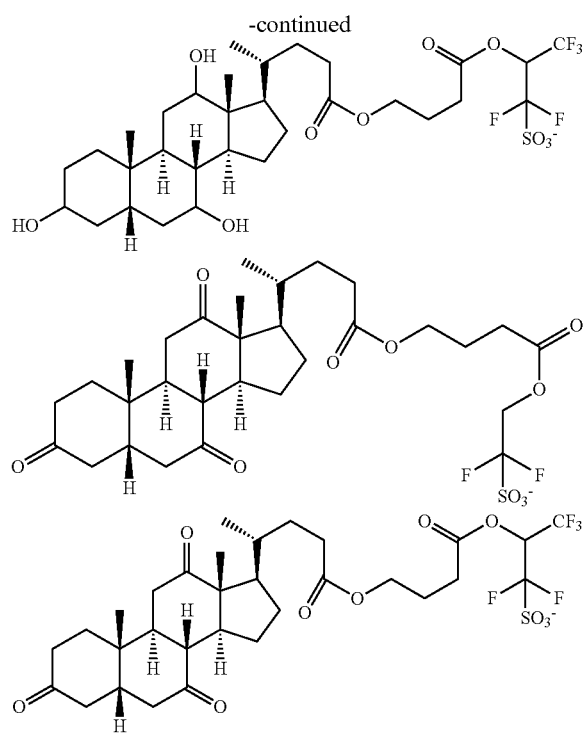

In the general formula (4'), $R^{09}$ represents a hydrogen atom or a trifluoromethyl group, preferably a trifluoromethyl group. $R^{10}$ represents a monovalent hydrocarbon group containing an aliphatic ring structure having 3 to 30 carbon atoms, optionally substituted with a heteroatom, and optionally having an intervening heteroatom. $R^{10}$ preferably represents a 1-norbornyl group, a 1-adamantyl group, a 2-adamantyl group, or a 4-oxo-1-adamantyl group.

One kind of the photo-acid generator (C) may be used or two or more kinds thereof may be used in combination to make appropriate adjustments to the pattern profile, exposure sensitivity, etc. of the resist upper layer film. The amount of the photo-acid generator (C) to be contained is preferably 1 mass % to 20 mass %, more preferably 5 mass % to 15 mass % based on a contained amount (100 mass %) of the resin (A). When the contained amount of the photo-acid generator (C) is within such ranges, resolution is favorable, and there is no risk of problems of foreign substances occurring after resist development or during removal.

[(D) Organic Solvent]

There is no particular restriction to the organic solvent (D) contained in the material for forming an adhesive film used in the inventive method for forming an adhesive film as long as the resin (A), the crosslinking agent (B), the photo-acid generator (C), if present, other additives, and so forth can be dissolved in the solvent. Specifically, solvents with a boiling point of lower than 180° C. such as those disclosed in paragraphs (0091) and (0092) of JP 2007-199653 A can be used. Above all, propylene glycol monomethyl ether acetate, propylene glycol monomethyl ether, 2-heptanone, cyclopentanone, cyclohexanone, and a mixture of two or more thereof are preferably used.

Such a composition can be applied by spin-coating, and since the inventive material for forming an adhesive film as described above is contained, it is possible to achieve a composition for forming an adhesive film that has high adhesiveness to a resist upper layer film and has an effect of suppressing fine pattern collapse.

[Other Additives]

The inventive material for forming an adhesive film can further contain one or more out of a surfactant, a plasticizer, and a colorant besides the components (A) to (D). Each component will be described below.

(Surfactant)

In the inventive material for forming an adhesive film, a surfactant can be contained so as to enhance the coating property in spin-coating. As examples of the surfactant, those disclosed in (0142) to (0147) of JP 2009-269953 A can be used.

(Plasticizer)

In addition, a plasticizer may be contained in the inventive material for forming an adhesive film. The plasticizer is not particularly limited, and known various types of plasticizers can be widely used. Examples thereof include low-molecular-weight compounds such as phthalic acid esters, adipic acid esters, phosphoric acid esters, trimellitic acid esters, and citric acid esters; and polymers such as polyethers, polyesters, and polyacetal-based polymers disclosed in JP 2013-253227 A.

(Colorant)

Furthermore, in the inventive material for forming an adhesive film, a colorant may be contained so as to enhance the resolution during patterning in multilayer lithography further. The colorant is not particularly limited as long as the colorant is a compound that has an appropriate absorption at the exposure wavelength, and known various compounds can be widely used. Examples thereof include benzenes, naphthalenes, anthracenes, phenanthrenes, pyrenes, isocyanuric acids, and triazines.

In addition, the inventive material for forming an adhesive film is extremely useful as an adhesive film material for multilayer resist processes such as a 4-layer resist process using a resist underlayer film and a silicon-containing middle layer film.

The silicon-containing middle layer film can be a silicon-containing resist middle layer film or an inorganic hard mask middle layer film in accordance with the patterning processes described below. The inorganic hard mask middle layer film is preferably selected from a silicon oxide film, a silicon nitride film, and a silicon oxynitride film.

[Method for Forming Adhesive Film]

The present invention provides a method for forming an adhesive film by using the above-described material for forming an adhesive film, the adhesive film having high adhesiveness to a resist upper layer film and having an effect of suppressing fine pattern collapse in a fine patterning process according to a multilayer resist method in a semiconductor device manufacturing process.

In the inventive method for forming an adhesive film, a substrate to be processed is coated with the above-described material for forming an adhesive film by a spin-coating method or the like. After the spin-coating, baking (a heat treatment) is performed in order to evaporate the organic solvent and promote a crosslinking reaction to prevent intermixing with the resist upper layer film or the silicon-containing middle layer film. The baking is preferably performed at 100° C. or higher and 300° C. or lower for 10 to 600 seconds, more preferably at 200° C. or higher and 250° C. or lower for 10 to 300 seconds. Considering the effect on damage to the adhesive film and deformation of the wafer, the upper limit of the heating temperature in the wafer process of the lithography is preferably set to 300° C. or lower, more preferably 250° C. or lower.

Alternatively, in the inventive method for forming an adhesive film, an adhesive film can also be formed by coating a substrate to be processed with the inventive material for forming an adhesive film by a spin-coating method or the like in the same manner as above and curing the material for forming an adhesive film by baking in an atmosphere having an oxygen concentration of 0.1% or more to 21% or less. By baking the inventive material for forming an adhesive film in such an oxygen atmosphere, a sufficiently cured film can be obtained.

The atmosphere during the baking may be in air, or an inert gas such as $N_2$, Ar, and He may also be introduced. In this event, the atmosphere may have an oxygen concentration of less than 0.1%. In addition, the baking temperature and so forth can be as described above. The crosslinking reaction during the adhesive film formation can be promoted without causing degradation of the substrate to be processed even when the substrate to be processed contains a material that is unstable to heating under an oxygen atmosphere.

[Patterning Process]

The present invention provides the following two methods as patterning processes according to 4-layer resist processes using the above-described material for forming an adhesive film. Firstly, the present invention provides a patterning process for forming a pattern in a substrate to be processed, including at least the following steps:

- forming a resist underlayer film by using an organic film material on the substrate to be processed;
- forming a silicon-containing middle layer film (silicon-containing resist middle layer film) by using a resist middle layer film material containing a silicon atom on the resist underlayer film;
- forming an adhesive film by using the inventive material for forming an adhesive film on the silicon-containing resist middle layer film;
- forming a resist upper layer film by using a resist upper layer film material including a photoresist composition on the adhesive film so that a multilayer resist film is constructed;
- forming a resist upper layer film pattern in the resist upper layer film by exposing a pattern circuit region of the resist upper layer film, then developing with a developer;
- forming an adhesive film pattern by etching the adhesive film while using the obtained resist upper layer film pattern as an etching mask;
- forming a silicon-containing resist middle layer film pattern by etching the silicon-containing resist middle layer film while using the obtained adhesive film pattern as an etching mask;
- forming a resist underlayer film pattern by etching the resist underlayer film while using the obtained silicon-containing resist middle layer film pattern as an etching mask; and
- further forming the pattern on the substrate to be processed by etching the substrate to be processed while using the obtained resist underlayer film pattern as an etching mask.

As the silicon-containing resist middle layer film in the 4-layer resist process, a polysilsesquioxane-based middle layer film is also favorably used. The silicon-containing resist middle layer film having an antireflective effect can suppress the reflection. Particularly, for 193-nm light exposure, a material containing many aromatic groups and having high substrate etching resistance is used as a resist underlayer film, so that the k-value and thus the substrate reflection are increased. However, the reflection can be suppressed by the silicon-containing resist middle layer film, and so the substrate reflection can be reduced to 0.5% or less. As the silicon-containing resist middle layer film having the antireflective effect, a polysilsesquioxane is preferably used, the polysilsesquioxane having anthracene for 248-nm and 157-nm light exposure, or a phenyl group or a light-absorbing group having a silicon-silicon bond for 193-nm light exposure in a pendant structure, and being crosslinked by an acid or heat.

In this case, forming a silicon-containing resist middle layer film by a spin-coating method is simpler and more advantageous regarding cost than a CVD method.

In addition, an inorganic hard mask middle layer film can be formed as a silicon-containing middle layer film, and in this case, a pattern can be formed in a substrate to be processed by performing at least the following steps:

- forming a resist underlayer film by using an organic film material on the substrate to be processed;
- forming an inorganic hard mask middle layer film selected from a silicon oxide film, a silicon nitride film, and a silicon oxynitride film on the resist underlayer film;
- forming an adhesive film by using the inventive material for forming an adhesive film on the inorganic hard mask middle layer film;
- forming a resist upper layer film by using a resist upper layer film material including a photoresist composition on the adhesive film;
- forming a resist upper layer film pattern in the resist upper layer film by exposing a pattern circuit region of the resist upper layer film, then developing with a developer;
- forming an adhesive film pattern by etching the adhesive film while using the obtained resist upper layer film pattern as an etching mask;
- forming an inorganic hard mask middle layer film pattern by etching the inorganic hard mask middle layer film while using the obtained adhesive film pattern as an etching mask;
- forming a resist underlayer film pattern by etching the resist underlayer film while using the obtained inorganic hard mask middle layer film pattern as an etching mask; and
- further forming the pattern in the substrate to be processed by etching the substrate to be processed while using the obtained resist underlayer film pattern as an etching mask.

In the case where an inorganic hard mask middle layer film is formed on the resist underlayer film as described above, a silicon oxide film, a silicon nitride film, and a silicon oxynitride film (SiON film) can be formed by a CVD method, an ALD method, or the like. The method for forming the silicon nitride film is disclosed in, for example, JP 2002-334869 A and WO 2004/066377 A1. The film thickness of the inorganic hard mask middle layer film is preferably 5 to 200 nm, more preferably 10 to 100 nm. As the inorganic hard mask middle layer film, a SiON film is most preferably used, being effective as an antireflective coating. When the SiON film is formed, the substrate temperature reaches 300 to 500° C. Hence, the resist underlayer film needs to withstand the temperature of 300 to 500° C.

The resist upper layer film in the 4-layer resist process may be a positive type or a negative type, and any generally-used photoresist composition can be employed. After spin-coating of the photoresist composition, pre-baking is preferably performed at 60 to 180° C. for 10 to 300 seconds. Then, light exposure, post-exposure baking (PEB), and development are performed according to conventional methods to obtain the resist upper layer film pattern. Note that the thickness of the resist upper layer film is not particularly limited, but is preferably 30 to 500 nm, and 50 to 400 nm is particularly preferable.

A circuit pattern (resist upper layer film pattern) is formed in the resist upper layer film. In the circuit pattern formation, the circuit pattern is preferably formed by a lithography using light having a wavelength of 10 nm or more to 300 nm or less, a direct drawing by electron beam, a nanoimprinting, or a combination thereof.

Note that examples of exposure light include a high-energy beam with a wavelength of 300 nm or less, specifically, deep ultraviolet ray, KrF excimer laser beam (248 nm), ArF excimer laser beam (1.93 nm), $F_2$ laser beam (157 nm), $Kr_2$ laser beam (146 nm), $Ar_2$ laser beam (126 nm), soft X-ray of 3 to 20 nm (EUV), electron beam (EB), ion beam, X-ray, and the like.

Additionally, in forming the circuit pattern, the circuit pattern is preferably developed by alkaline development or development with an organic solvent.

Next, etching is performed while using the obtained resist upper layer film pattern as a mask. The etching of the adhesive film in the 4-layer resist process is performed by using an oxygen-based gas while using the resist upper layer film pattern as a mask. Thereby, the adhesive film pattern is formed.

Subsequently, etching is performed while using the obtained adhesive film pattern as a mask. The etching of the silicon-containing resist middle layer film and the inorganic hard mask middle layer film is performed by using a fluorocarbon-based gas while using the adhesive film pattern as a mask. Thereby, the silicon-containing resist middle layer film pattern and the inorganic hard mask middle layer film pattern are formed.

The etching of the adhesive film may be performed continuously before the etching of the silicon-containing middle layer film. Alternatively, after the adhesive film is etched alone, the etching apparatus is changed, for example, and then the etching of the silicon-containing middle layer film may be performed.

Next, the resist underlayer film is etched while using the obtained silicon-containing resist middle layer film pattern and inorganic hard mask middle layer film pattern as masks.

Subsequently, the substrate to be processed can be etched according to a conventional method. For example, the substrate to be processed made of $SiO_2$, SiN, or silica-based low-dielectric insulating film is etched mainly with a fluorocarbon-based gas; and p-Si, Al, or W is etched mainly with a chlorine- or bromine-based gas. When the substrate is processed by etching with a fluorocarbon-based gas, the silicon-containing middle layer film pattern in the 3-layer resist process is removed when the substrate is processed. When the substrate is etched with a chlorine- or bromine-based gas, the silicon-containing middle layer film pattern needs to be removed by additional dry etching with a fluorocarbon-based gas after the substrate processing.

Note that the substrate to be processed is not particularly limited, and it is possible to use a semiconductor device substrate or the semiconductor device substrate coated with any of a metal film, a metal carbide film, a metal oxide film, a metal nitride film, a metal oxycarbide film, or a metal oxynitride film. As the metal, it is possible to use silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof.

Specific examples include: substrates made of Si, α-Si, p-Si, $SiO_2$, SiN, SiON, W, TiN, Al, or the like; the substrate coated with a layer to be processed; etc. Examples of the layer to be processed include: various Low-k films made of Si, $SiO_2$, SiON, SiN, p-Si, α-Si, W, W—Si, Al, Cu, Al—Si, or the like; and stopper films thereof. Generally, the layer can be formed to have a thickness of 50 to 10,000 nm, in particular, 100 to 5,000 nm. Note that when the layer to be processed is formed, the substrate and the layer to be processed are formed from different materials.

Hereinbelow, an example of the 4-layer resist process will be specifically described with reference to FIG. 1. As shown in FIG. 1(A), in the 4-layer resist process, a resist underlayer film 3 is formed by using an organic film material on a layer 2 to be processed that has been stacked on a substrate 1. Then, a silicon-containing middle layer film 4 is formed, an adhesive film 5 is formed by using the inventive material for forming an adhesive film thereon, and a resist upper layer film 6 is formed thereon.

Next, as shown in FIG. 1(B), a predetermined portion 7 of the resist upper layer film is exposed to light, followed by PEB and development to form a resist pattern 6a (FIG. 1(C)). While using the obtained resist pattern 6a as a mask, the adhesive film 5 is etched by using an $O_2$-based gas. Thereby, an adhesive film pattern 5a is formed (FIG. 1(D)). While using the obtained adhesive film 5a as a mask, the silicon-containing middle layer film 4 is etched by using a CF-based gas. Thereby, a silicon-containing middle layer film pattern 4a is formed (FIG. 1(E)). After the adhesive film pattern 5a is removed, the resist underlayer film 3 is etched with an $O_2$-based gas while using the obtained silicon-containing middle layer film pattern 4a as a mask. Thereby, a resist underlayer film pattern 3a is formed (FIG. 1(F)). Furthermore, after the silicon-containing middle layer film pattern 4a is removed, the layer 2 to be processed is etched while using the resist underlayer film pattern 3a as a mask. Thus, a pattern 2a is formed (FIG. 1(G)).

As described above, the inventive patterning processes make it possible to form a fine pattern with high precision in a substrate to be processed in the multilayer resist processes.

EXAMPLE

Hereinafter, the present invention will be described further specifically with reference to Synthesis Examples, Comparative Synthesis Examples, Examples, and Comparative Examples. However, the present invention is not limited thereto. Note that, specifically, the molecular weight was measured by the following method. Weight-average molecular weight (Mw) and number-average molecular weight (Mn) were measured by gel permeation chromatography (GPC) using tetrahydrofuran as an eluent in terms of polystyrene, and dispersity (Mw/Mn) was calculated therefrom.

Polymers (A1) to (A6) and comparative polymers (R1) to (R3) to be used as a resin (A) for materials for forming an adhesive film were synthesized using the monomers (B1) to (B9) shown below.

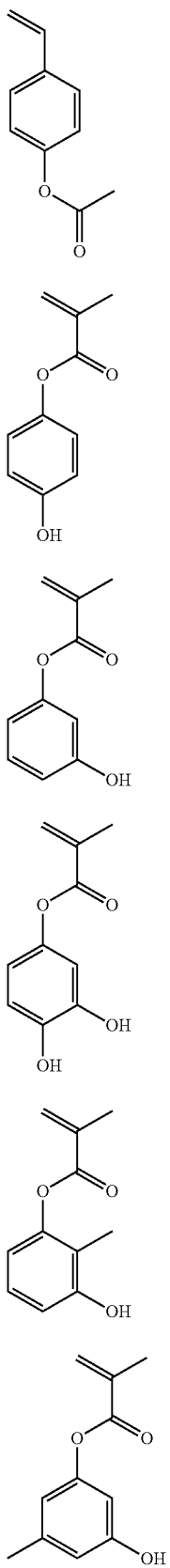
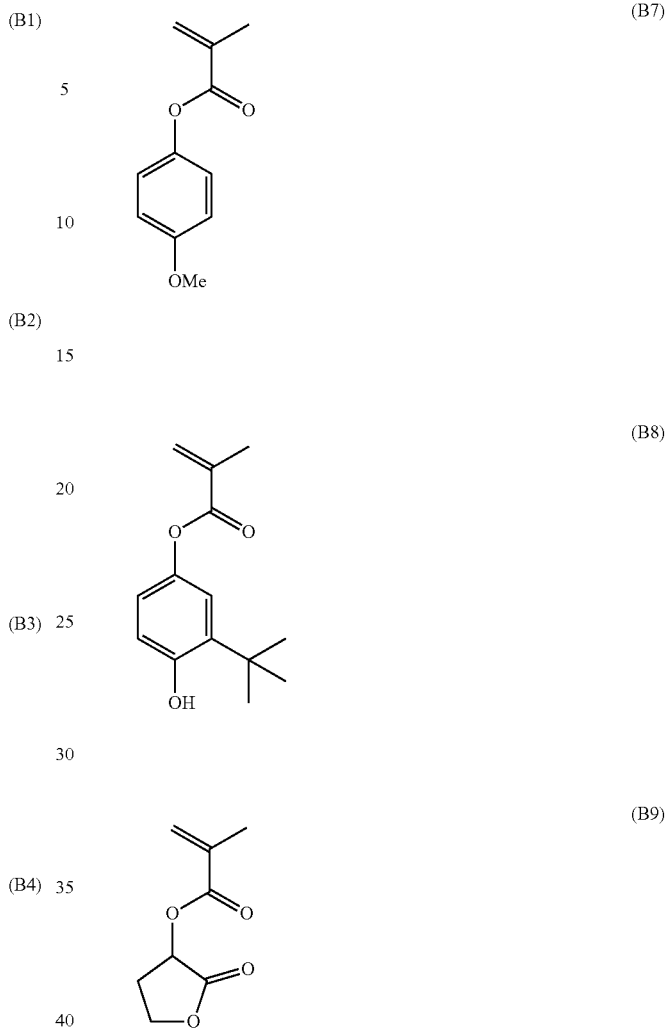

[Synthesis Example 1] Synthesis of Polymer (A1)

A 2-L flask was charged with 16.2 g of 4-acetoxystyrene (B1), and as a solvent, 50 g of tetrahydrofuran. This reaction container was cooled to −70° C. under nitrogen atmosphere. Vacuum degassing and nitrogen blowing were repeated three times. After the temperature was raised to room temperature, 1.2 g of AIBN (azobisisobutyronitrile) was added as a polymerization initiator, the temperature was raised to 60° C., and the reaction was allowed to take place for 15 hours. This reaction solution was added to 1 L of isopropyl alcohol solution and precipitated. A white solid thus obtained was dissolved once more in a mixed solvent of 100 mL of methanol and 200 mL of tetrahydrofuran. 10 g of trimethylamine and 10 g of water were added thereto. Deprotection reaction of acetyl groups was conducted at 70° C. for 5 hours, followed by neutralization with acetic acid. The reaction solution was concentrated, and then dissolved in 100 mL of acetone. By similar precipitation, subsequent filtration, and drying at 60° C., a white polymer (A1) was obtained. When measured by GPC, the weight-average molecular weight (Mw) and dispersity (Mw/Mn) were Mw=8,500 and Mw/Mn=1.68.

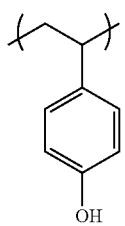

(A1)

[Synthesis Example 2] Synthesis of Polymer (A2)

A 2-L flask was charged with 17.8 g of 4-hydroxyphenyl methacrylate (B2), and as a solvent, 50 g of tetrahydrofuran. This reaction container was cooled to −70° C. under nitrogen atmosphere. Vacuum degassing and nitrogen blowing were repeated three times. After the temperature was raised to room temperature, 1.2 g of AIBN (azobisisobutyronitrile) was added as a polymerization initiator, the temperature was raised to 60° C., and the reaction was allowed to take place for 15 hours. This reaction solution was added to 1 L of isopropyl alcohol solution and precipitated. The obtained white solid was collected by filtration and vacuum dried at 60° C. to obtain a white polymer (A2). When measured by GPC, the weight-average molecular weight (Mw) and dispersity (Mw/Mn) were Mw=11,000 and Mw/Mn=2.11.

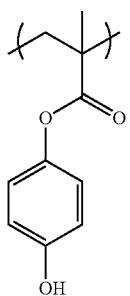

(A2)

[Synthesis Examples 3 to 6] Synthesis of Polymers (A3) to (A6)

Except that the monomers shown in Table 1 were used, the polymers (A3) to (A6) shown in Table 1 were obtained as products under the same reaction conditions as in Synthesis Example 2. In addition, the weight-average molecular weight (Mw) and dispersity (Mw/Mn) determined by GPC are shown.

TABLE 1

| Synthesis Example | Polymer | Monomer | Polymerization initiator (AIBN) | Molecular weight (Mw) | Dispersity (Mw/Mn) |
|---|---|---|---|---|---|
| 1 | A1 | B1 16.2 g | 1.2 g | 8,500 | 1.68 |
| 2 | A2 | B2 17.8 g | 1.2 g | 11,000 | 2.11 |
| 3 | A3 | B3 17.8 g | 1.2 g | 10,400 | 2.06 |
| 4 | A4 | B4 19.4 g | 1.2 g | 8,900 | 1.92 |
| 5 | A5 | B5 19.2 g | 1.2 g | 12,200 | 2.18 |
| 6 | A6 | B6 19.2 g | 1.2 g | 12,600 | 2.21 |

[Comparative Synthesis Example 1] Synthesis of Comparative Polymer (R1)

A 2-L flask was charged with 19.2 g of 4-methoxyphenyl methacrylate (B7), and as a solvent, 50 g of tetrahydrofuran. This reaction container was cooled to −70° C. under nitrogen atmosphere. Vacuum degassing and nitrogen blowing were repeated three times. After the temperature was raised to room temperature, 1.2 g of AIBN (azobisisobutyronitrile) was added as a polymerization initiator, the temperature was raised to 60° C., and the reaction was allowed to take place for 15 hours. This reaction solution was added to 1 L of isopropyl alcohol solution and precipitated. The obtained white solid was collected by filtration and vacuum dried at 60° C. to obtain a white polymer (R1). When measured by CPC, the weight-average molecular weight (Mw) and dispersity (Mw/Mn) were Mw=11,700 and Mw/Mn=2.14.

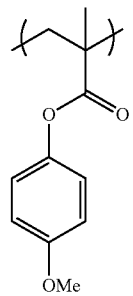

(R1)

[Comparative Synthesis Example 2] Synthesis of Comparative Polymer (R2)

A 2-L flask was charged with 23.4 g of 3-tert-butyl-4-hydroxyphenyl methacrylate (B8), and as a solvent, 50 g of tetrahydrofuran. This reaction container was cooled to −70° C. under nitrogen atmosphere. Vacuum degassing and nitrogen blowing were repeated three times. After the temperature was raised to room temperature, 1.2 g of AIBN (azobisisobutyronitrile) was added as a polymerization initiator, the temperature was raised to 60° C., and the reaction was allowed to take place for 15 hours. This reaction solution was added to 1 L of isopropyl alcohol solution and precipitated. The obtained white solid was collected by filtration and vacuum dried at 60° C. to obtain a white polymer (R2). When measured by GPC, the weight-average molecular weight (Mw) and dispersity (Mw/Mn) were Mw=8,700 and Mw/Mn=1.69.

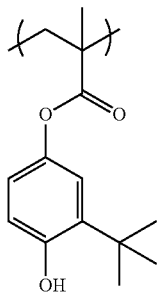

(R2)

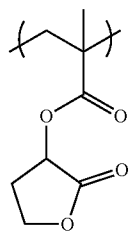

(R3)

When measured by GPC, the weight-average molecular weight (Mw) and dispersity (Mw/Mn) were Mw=9,700 and Mw/Mn=2.03.

[Comparative Synthesis Example 3] Synthesis of Comparative Polymer (R3)

A 2-L flask was charged with 17.0 g of 2-oxotetrahydrofuran-3-yl methacrylate (B9), and as a solvent, 50 g of tetrahydrofuran. This reaction container was cooled to −70° C. under nitrogen atmosphere. Vacuum degassing and nitrogen blowing were repeated three times. After the temperature was raised to room temperature, 1.2 g of AIBN (azobisisobutyronitrile) was added as a polymerization initiator, the temperature was raised to 60° C., and the reaction was allowed to take place for 15 hours. This reaction solution was added to 1 L of isopropyl alcohol solution and precipitated. The obtained white solid was collected by filtration and vacuum dried at 60° C. to obtain a white polymer (R3).

Preparation of Materials (AL-1 to -17, Comparative AL-1 to -9) for Forming Adhesive Film For the preparation of materials for forming an adhesive film and comparative materials, the following were used: the polymers (A1) to (A6) and comparative polymers (R1) to (R3); (X1) to (X4) as crosslinking agents; (P1) to (P3) as photo-acid generators; and (AG1) as a thermal acid generator. Using propylene glycol monomethyl ether acetate (PGMEA) containing 0.1 mass % of PF636 (manufactured by OMNOVA), the compounds were dissolved in proportions shown in Table 2. The solution was then filtered through a 0.1-μm filter made of fluorinated resin to prepare materials (AL-1 to -17, comparative AL-1 to -9) for forming an adhesive film.

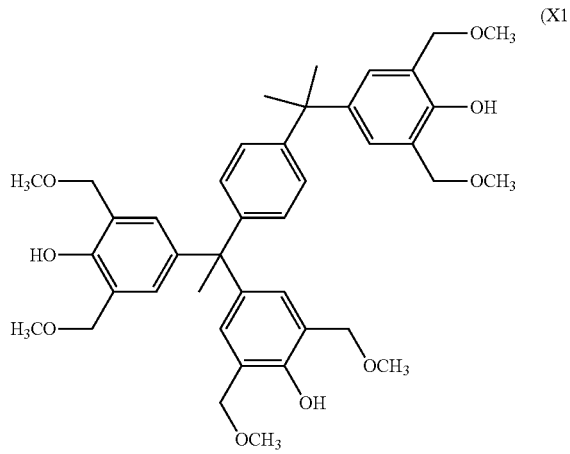

(X1)

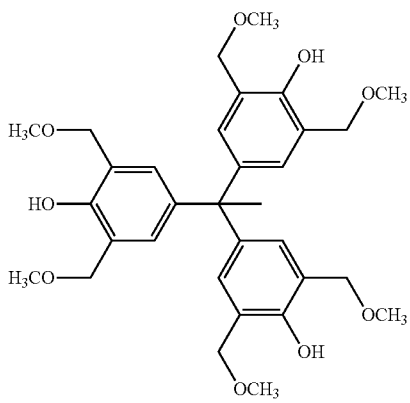

(X2)

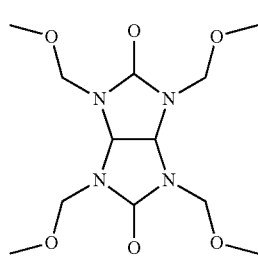

(X3)

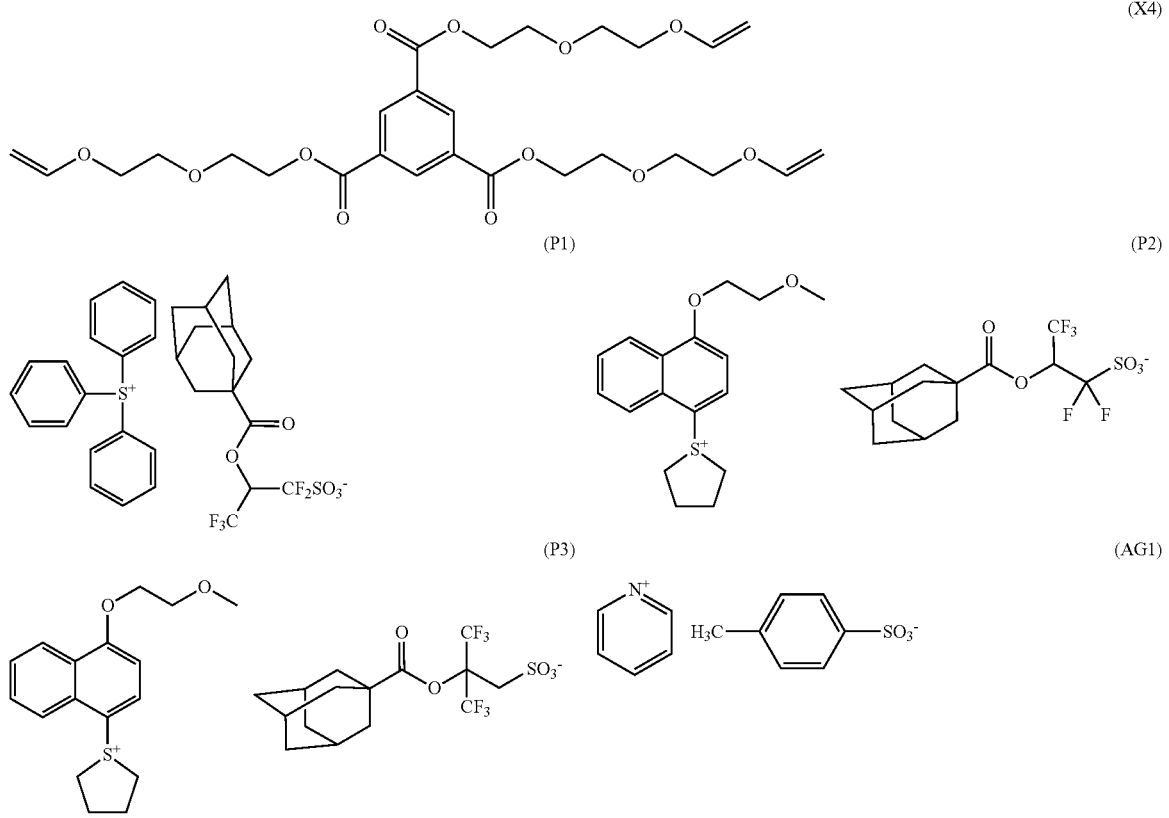

TABLE 2

| Material for forming adhesive film | Polymer (parts by mass) | Cross-linking agent (parts by mass) | Photo-acid generator (parts by mass) | Thermal acid generator (parts by mass) | PGMEA (parts by mass) |
|---|---|---|---|---|---|
| AL-1 | A1(10) | X1(3) | P1(1) | — | 2500 |
| AL-2 | A2(10) | X1(3) | P1(1) | — | 2500 |
| AL-3 | A3(10) | X1(3) | P1(1) | — | 2500 |
| AL-4 | A4(10) | X1(3) | P1(1) | — | 2500 |
| AL-5 | A5(10) | X1(3) | P1(1) | — | 2500 |
| AL-6 | A6(10) | X1(3) | P1(1) | — | 2500 |
| AL-7 | A2(10) | X1(1) X2(1) | P1(0.9) | — | 2400 |
| AL-8 | A2(10) | X1(1) X2(1) | P2(0.8) | — | 2400 |
| AL-9 | A2(10) | X1(2) | P1(0.2) P2(0.8) | — | 2400 |
| AL-10 | A2(10) | X1(2) | P1(0.2) P3(0.8) | — | 2400 |
| AL-11 | A3(10) | X1(2) | P2(1.2) | — | 2400 |
| AL-12 | A6(10) | X1(2) | P2(1.2) | — | 2400 |
| AL-13 | A2(10) | X1(3) | P3(0.9) | — | 2500 |
| AL-14 | A4(10) | X1(1) X2(1) | P1(0.9) | — | 2400 |
| AL-15 | A4(10) | X1(1) X2(1) | P2(0.8) | — | 2400 |
| AL-16 | A4(10) | X1(2) | P1(0.2) P2(0.8) | — | 2400 |
| AL-17 | A4(10) | X1(2) | P1(0.2) P3(0.7) | — | 2400 |
| Comparative AL-1 | R1(10) | X1(3) | P1(1) | — | 2500 |
| Comparative AL-2 | R2(10) | X1(3) | P1(1) | — | 2500 |
| Comparative AL-3 | R3(10) | X1(3) | P1(1) | — | 2500 |
| Comparative AL-4 | A2(10) | X1(3) | — | — | 2500 |
| Comparative AL-5 | A2(10) | — | P1(1) | — | 2500 |
| Comparative AL-6 | A4(10) | X3(3) | P1(1) | — | 2500 |
| Comparative AL-7 | A4(10) | X3(3) | P1(1) | AG1(0.5) | 2500 |
| Comparative AL-8 | A2(10) | X4(3) | P1(1) | — | 2500 |
| Comparative AL-9 | A2(10) | X4(5) | P1(1) | — | 2500 |

Example 1: Solvent Resistance Evaluation
(Examples 1-1 to 1-17, Comparative Examples 1-1 to 1-9)

The materials (AL-1 to -17, comparative AL-1 to -9) for forming an adhesive film prepared above were respectively applied onto a silicon substrate and baked at 220° C. for 60 seconds. Then, the film thickness was measured. A PGMEA solvent was dispensed thereon, left to stand for 30 seconds, spin-dried, and baked at 100° C. for 60 seconds to evaporate the PGMEA solvent. The film thickness was then remeasured. Solvent resistance was evaluated by determining the difference between the film thicknesses of before and after the PGMEA treatment. Table 3 shows the results.

TABLE 3

| | Material for forming adhesive film | Film thickness after film formation: a (Å) | Film thickness after PGMEA treatment: b (Å) | b/a × 100 (%) |
|---|---|---|---|---|
| Example 1-1 | AL-1 | 206 | 204 | 99.1 |
| Example 1-2 | AL-2 | 201 | 199 | 98.9 |
| Example 1-3 | AL-3 | 205 | 203 | 99.0 |
| Example 1-4 | AL-4 | 213 | 211 | 99.2 |
| Example 1-5 | AL-5 | 205 | 203 | 99.0 |
| Example 1-6 | AL-6 | 209 | 207 | 99.0 |
| Example 1-7 | AL-7 | 209 | 207 | 99.1 |
| Example 1-8 | AL-8 | 211 | 208 | 98.6 |
| Example 1-9 | AL-9 | 204 | 202 | 99.1 |
| Example 1-10 | AL-10 | 203 | 201 | 98.9 |
| Example 1-11 | AL-11 | 207 | 205 | 99.2 |
| Example 1-12 | AL-12 | 208 | 207 | 99.4 |
| Example 1-13 | AL-13 | 203 | 200 | 98.5 |
| Example 1-14 | AL-14 | 201 | 200 | 99.3 |
| Example 1-15 | AL-15 | 202 | 200 | 99.2 |
| Example 1-16 | AL-16 | 210 | 209 | 99.3 |
| Example 1-17 | AL-17 | 203 | 201 | 98.8 |
| Comparative Example 1-1 | Comparative AL-1 | 206 | 204 | 99.3 |
| Comparative Example 1-2 | Comparative AL-2 | 204 | 203 | 99.2 |
| Comparative Example 1-3 | Comparative AL-3 | 208 | 206 | 99.2 |
| Comparative Example 1-4 | Comparative AL-4 | 205 | 203 | 99.1 |
| Comparative Example 1-5 | Comparative AL-5 | 201 | 157 | 78.1 |
| Comparative Example 1-6 | Comparative AL-6 | 213 | 146 | 68.4 |
| Comparative Example 1-7 | Comparative AL-7 | 208 | 206 | 99.0 |
| Comparative Example 1-8 | Comparative AL-8 | 202 | 186 | 91.9 |
| Comparative Example 1-9 | Comparative AL-9 | 205 | 190 | 92.5 |

As shown in Table 3, in Examples 1-1 to 1-17, in which the inventive materials (AL-1 to -17) for forming an adhesive film were used, there was hardly any reduction in film thickness due to treatment with a solvent, and it can be observed that a film having favorable solvent resistance was obtained. On the other hand, in Comparative Example 1-5, in which no crosslinking agent was contained, it can be observed that sufficient solvent resistance was not achieved. Meanwhile, comparing Comparative Example 1-6 with Comparative Example 1-7, curability was insufficient in Comparative Example 1-6, in which no thermal acid generator was contained, and it can be observed that when using the crosslinking agent X3, it is necessary to use the crosslinking agent X3 in combination with a thermal acid generator. Furthermore, it can be observed that in Comparative Examples 1-8 and 1-9, in which the crosslinking agent X4 was used, it was not possible to achieve sufficient solvent resistance with baking at 220° C.

Example 2: Adhesiveness Test (Examples 2-1 to 2-17, Comparative Examples 2-1 to 2-5)

The materials (AL-1 to -17, comparative AL-1 to -4, -7) for forming an adhesive film were each applied onto an SiO₂ wafer substrate and baked at 220° C. for 60 seconds in the atmosphere by using a hot plate. Thus, an adhesive film with a film thickness of 200 nm was formed. This wafer with an adhesive film was cut into a 1×1 cm square, and an aluminum pin with epoxy adhesive was fastened to the cut wafer with a dedicated jig. Thereafter, the assembly was heated with an oven at 150° C. for 1 hour to bond the aluminum pin to the substrate. After cooling to room temperature, initial adhesiveness was evaluated based on the resistance force by a thin-film adhesion strength measurement apparatus (Sebastian Five-A).

FIG. 2 shows an explanatory diagram showing an adhesiveness measurement method. In FIG. 2, reference number 8 denotes a silicon wafer (substrate), 9 denotes a cured film, 10 denotes an aluminum pin with adhesive, 11 denotes a support, 12 denotes a grip, and 13 denotes a tensile direction. The adhesion is an average of 12 measurement points, and a larger value indicates that the adhesive film has higher adhesiveness with respect to the substrate. The adhesiveness was evaluated by comparing the obtained values. Table 4 shows the results.

TABLE 4

| | Material for forming adhesive film | Adhesion (mN) |
|---|---|---|
| Example 2-1 | AL-1 | 370 |
| Example 2-2 | AL-2 | 520 |
| Example 2-3 | AL-3 | 460 |
| Example 2-4 | AL-4 | 640 |
| Example 2-5 | AL-5 | 420 |
| Example 2-6 | AL-6 | 480 |
| Example 2-7 | AL-7 | 530 |
| Example 2-8 | AL-8 | 490 |
| Example 2-9 | AL-9 | 520 |
| Example 2-10 | AL-10 | 520 |
| Example 2-11 | AL-11 | 470 |
| Example 2-12 | AL-12 | 450 |
| Example 2-13 | AL-13 | 530 |
| Example 2-14 | AL-14 | 620 |
| Example 2-15 | AL-15 | 610 |
| Example 2-16 | AL-16 | 620 |
| Example 2-17 | AL-17 | 600 |
| Comparative Example 2-1 | Comparative AL-1 | 160 |
| Comparative Example 2-2 | Comparative AL-2 | 210 |
| Comparative Example 2-3 | Comparative AL-3 | 330 |
| Comparative Example 2-4 | Comparative AL-4 | 530 |
| Comparative Example 2-5 | Comparative AL-7 | 600 |

As shown in Table 4, it was observed that in Examples 2-1 to 2-17, in which the inventive materials (AL-1 to -17) for forming an adhesive film were used, adhesion was excellent compared with Comparative Example 2-1, in which a polymer containing no hydroxy groups was contained, and Comparative Example 2-2, in which a polymer having a bulky substituent with 4 carbon atoms near a hydroxy group was contained. It can be seen that in Examples 2-4 and 2-14 to -17, in which a polymer having two hydroxy groups in adjacent positions was contained, particularly excellent adhesiveness was exhibited.

Example 3: Patterning Test (Examples 3-1 to 3-17, Comparative Examples 3-1 to 3-5)

Spin-on carbon ODL-301 (carbon content: 88 mass %) available from Shin-Etsu Chemical Co., Ltd. was applied to silicon wafer substrates and the resulting substrates were baked at 350° C. for 60 seconds to form a 200-nm thick resist underlayer film. A CVD-SiON hard mask middle layer film was formed thereon, and further, each of the materials (AL-1 to -17, comparative AL-1 to -4, -7) for forming an adhesive film was respectively applied and baked at 220° C. for 60 seconds to form an adhesive film having a film thickness of 20 nm. A monolayer resist for ArF was applied thereon as a resist upper layer film material and baked at 105° C. for 60 seconds to form a resist upper layer film having a film thickness of 100 nm. A liquid immersion top coat material (TC-1) was applied on the resist upper layer film and baked at 90° C. for 60 seconds to form a top coat having a film thickness of 50 nm.

The resist upper layer film material (monolayer resist for ArF) was prepared by: dissolving a polymer (PRP-A1), an acid generator (PAG1), and a basic compound (Amine1) into a solvent containing 0.1 mass % FC-430 (manufactured by Sumitomo 3M Ltd.) in proportions shown in Table 5; and filtering the solution through a 0.1-μm filter made of a fluorinated resin.

TABLE 5

|  | Polymer (parts by mass) | Acid generator (parts by mass) | Basic compound (parts by mass) | Solvent (parts by mass) |
|---|---|---|---|---|
| SL resist for ArF | PRP-A1 (100) | PAG1 (6.6) | Amine1 (0.8) | PGMEA (2500) |

Polymer for resist: PRP-A1
Molecular weight (Mw)=8,600
Dispersity (Mw/Mn)=1.88

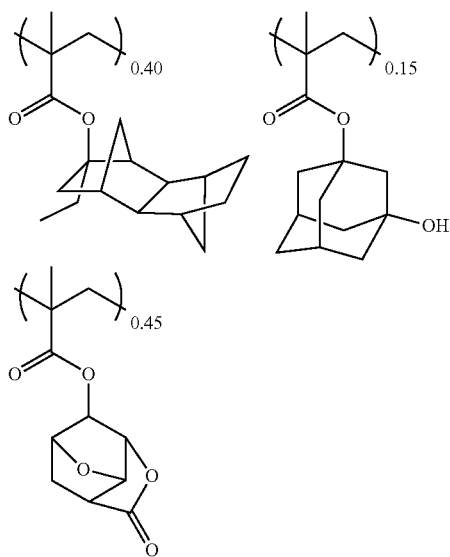

Acid generator: PAG1

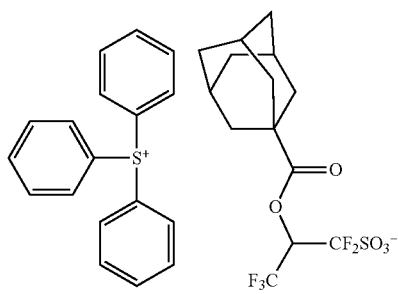

Basic Compound: Amine1

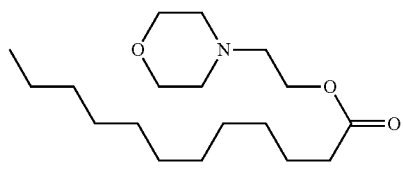 [SMILES: CCCCCCCCCCCC(=O)OCCN1CCOCC1]

The liquid immersion top coat material (TC-1) was prepared by: dissolving a top coat polymer (PP1) into organic solvents in proportions shown in Table 6; and filtering the solution through a 0.1-μm filter made of a fluorinated resin.

TABLE 6

|  | Polymer (parts by mass) | Organic solvent (parts by mass) |
|---|---|---|
| TC-1 | PP1 (100) | Diisoamyl ether (2700) 2-methyl-1-butanol (270) |

Top coat polymer: PP1
Molecular weight (Mw)=8,800
Dispersity (Mw/Mn)=1.69

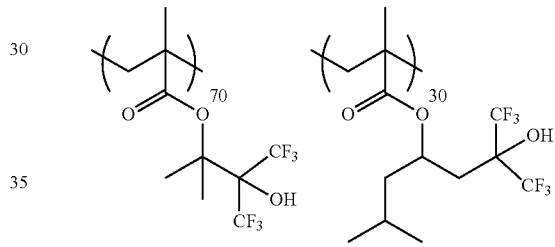

Next, the resulting substrate was exposed to light with an ArF liquid immersion exposure apparatus (NSR—S610C manufactured by Nikon Corporation, NA: 1.30, σ: 0.98/0.65, 35° s-polarized dipole illumination, 6% halftone phase shift mask), baked (PEB) at 100° C. for 60 seconds, and developed with a 2.38 mass % aqueous solution of tetramethylammonium hydroxide (TMAH) for 30 seconds. Thus, a 40-nm 1:1 line-and-space pattern was obtained. Regarding this pattern, the sectional profile and roughness were observed with an electron microscope. The collapse limit (nm) was a minimum width of the lines which could be resolved without collapse when the line width was reduced by increasing the exposure dose. A smaller value indicates higher and better collapse resistance.

The cross-sectional profile of the obtained pattern was evaluated with an electron microscope (S-4700) manufactured by Hitachi, Ltd. and the pattern roughness was evaluated with an electron microscope (CG4000) manufactured by Hitachi High-Technologies Corp. Table 7 shows the results.

TABLE 7

|  | Material for forming adhesive film | Pattern sectional profile after development | Pattern roughness (nm) | Collapse limit (nm) |
|---|---|---|---|---|
| Example 3-1 | AL-1 | Vertical profile | 1.6 | 32 |

TABLE 7-continued

| | Material for forming adhesive film | Pattern sectional profile after development | Pattern roughness (nm) | Collapse limit (nm) |
|---|---|---|---|---|
| Example 3-2 | AL-2 | Vertical profile | 1.7 | 28 |
| Example 3-3 | AL-3 | Vertical profile | 1.6 | 29 |
| Example 3-4 | AL-4 | Vertical profile | 1.7 | 26 |
| Example 3-5 | AL-5 | Vertical profile | 1.6 | 30 |
| Example 3-6 | AL-6 | Vertical profile | 1.6 | 30 |
| Example 3-7 | AL-7 | Vertical profile | 1.6 | 31 |
| Example 3-8 | AL-8 | Vertical profile | 1.6 | 29 |
| Example 3-9 | AL-9 | Vertical profile | 1.6 | 29 |
| Example 3-10 | AL-10 | Vertical profile | 1.7 | 29 |
| Example 3-11 | AL-11 | Vertical profile | 1.6 | 30 |
| Example 3-12 | AL-12 | Vertical profile | 1.6 | 30 |
| Example 3-13 | AL-13 | Vertical profile | 1.7 | 29 |
| Example 3-14 | AL-14 | Vertical profile | 1.7 | 28 |
| Example 3-15 | AL-15 | Vertical profile | 1.6 | 26 |
| Example 3-16 | AL-16 | Vertical profile | 1.6 | 27 |
| Example 3-17 | AL-17 | Vertical profile | 1.6 | 27 |
| Comparative Example 3-1 | Comparative AL-1 | Vertical profile | 2.2 | 39 |
| Comparative Example 3-2 | Comparative AL-2 | Vertical profile | 2.3 | 37 |
| Comparative Example 3-3 | Comparative AL-3 | Vertical profile | 2.2 | 35 |
| Comparative Example 3-4 | Comparative AL-4 | Trailing profile | 2.4 | 28 |
| Comparative Example 3-5 | Comparative AL-7 | Undercut profile | 2.1 | 37 |

As shown in Table 7, it can be observed that better collapse suppression performance was exhibited and that it was possible to form finer patterns in Examples 3-1 to 3-17, where the inventive materials (AL-1 to -17) for forming an adhesive film were used, compared with the Comparative Examples. Furthermore, it can be observed that excellent pattern profile and pattern roughness were achieved by making appropriate adjustments to the photo-acid generator. In Comparative Examples 3-1 to 3-3, in which the resins contained in the inventive materials for forming an adhesive film were not contained and adhesion was low, pattern collapse suppression performance was low. In Comparative Example 3-4, containing no photo-acid generator, and in Comparative Example 3-5, not containing the crosslinking agents contained in the inventive materials for forming an adhesive film, degradation was observed in the sectional profile of the pattern.

From the above, the inventive materials for forming an adhesive film have high adhesiveness to a resist upper layer film, and have an effect of suppressing fine pattern collapse, and are therefore extremely useful as adhesive film materials to be used in multilayer resist methods. In addition, according to the inventive patterning processes using these materials, a fine pattern can be formed in a substrate to be processed with high precision.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A material for forming an adhesive film formed between a silicon-containing middle layer film and a resist upper layer film, the material for forming an adhesive film comprising: (A) a resin consisting of a structural unit shown by the following general formula (1); (B) a crosslinking agent containing one or more compounds shown by the following general formula (2); (C) a photo-acid generator; and (D) an organic solvent, and comprising no thermal acid generator,

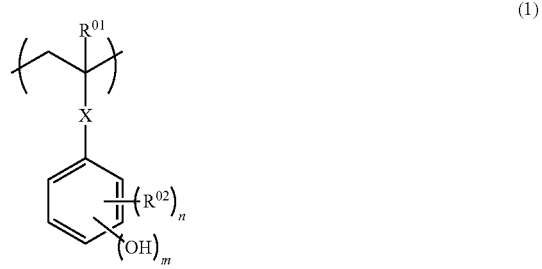

(1)

wherein $R^{01}$ represents a hydrogen atom or a methyl group, $R^{02}$ represents an alkyl group having 1 to 3 carbon atoms, "m" represents an integer of 1 or 2, "n" represents an integer of 0 to 4, m+n is an integer of 1 or more and 5 or less, and X represents $-C(=O)O-$,

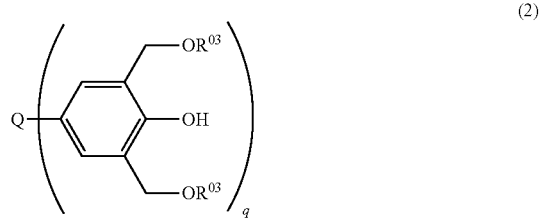

(2)

wherein Q represents a single bond or a hydrocarbon group with a valency of "q" having 1 to 20 carbon atoms, $R^{03}$ represents a hydrogen atom or a methyl group, and "q" represents an integer of 1 to 5.

2. The material for forming an adhesive film according to claim 1, wherein the silicon-containing middle layer film is a silicon-containing resist middle layer film or an inorganic hard mask middle layer film.

3. The material for forming an adhesive film according to claim 1, comprising one or more compounds shown by the following general formula (3) as the photo-acid generator (C),

(3)

wherein $R^{04}$, $R^{05}$, and $R^{06}$ each independently represent a linear alkyl group or alkenyl group having 1 to 10 carbon atoms or a branched or cyclic alkyl group or alkenyl group having 3 to 10 carbon atoms, optionally substituted with a heteroatom, and optionally having an intervening heteroatom, or represent an aryl group or aralkyl group having 6 to 18 carbon atoms, optionally substituted with a heteroatom, and optionally having an intervening heteroatom, wherein any two of $R^{04}$, $R^{05}$, and $R^{06}$ are optionally bonded with each other to form a ring with the sulfur atom in the formula, and $Y^-$ represents one of the following general formulae (4) and (5),

(4)

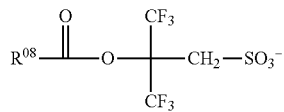
(5)

wherein $R^{07}$ and $R^{08}$ each independently represent a monovalent hydrocarbon group containing an aliphatic ring structure having 3 to 40 carbon atoms, optionally substituted with a heteroatom, and optionally having an intervening heteroatom.

4. The material for forming an adhesive film according to claim 3, wherein the general formula (4) is shown by the following general formula (4'),

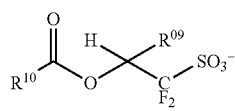
(4')

wherein $R^{09}$ represents a hydrogen atom or a trifluoromethyl group, and $R^{10}$ represents a monovalent hydrocarbon group containing an aliphatic ring structure having 3 to 30 carbon atoms, optionally substituted with a heteroatom, and optionally having an intervening heteroatom.

5. The material for forming an adhesive film according to claim 1, wherein the resin (A) has a weight-average molecular weight of 1,000 to 20,000.

6. The material for forming an adhesive film according to claim 1, wherein a contained amount of the crosslinking agent (B) is 10 mass % to 50 mass % based on a contained amount of the resin (A).

7. The material for forming an adhesive film according to claim 1, wherein a contained amount of the photo-acid generator (C) is 1 mass % to 20 mass % based on a contained amount of the resin (A).

8. The material for forming an adhesive film according to claim 1, further comprising one or more out of a surfactant, a plasticizer, and a colorant.

9. A patterning process for forming a pattern in a substrate to be processed, comprising the steps of:
(I-1) forming a resist underlayer film on the substrate to be processed;
(I-2) forming a silicon-containing resist middle layer film on the resist underlayer film;
(I-3) applying the material for forming an adhesive film according to claim 1 on the silicon-containing resist middle layer film and then performing a heat treatment to form an adhesive film;
(I-4) forming a resist upper layer film on the adhesive film by using a photoresist material;
(I-5) subjecting the resist upper layer film to pattern exposure and then to development with a developer to form a pattern in the resist upper layer film;
(I-6) transferring the pattern to the adhesive film by dry etching while using the resist upper layer film having the formed pattern as a mask;
(I-7) transferring the pattern to the silicon-containing resist middle layer film by dry etching while using the adhesive film having the formed pattern as a mask; and
(I-8) transferring the pattern to the resist underlayer film by dry etching while using the silicon-containing resist middle layer film having the transferred pattern as a mask.

10. A patterning process for forming a pattern in a substrate to be processed, comprising the steps of:
(II-1) forming a resist underlayer film on the substrate to be processed;
(II-2) forming an inorganic hard mask middle layer film selected from a silicon oxide film, a silicon nitride film, and a silicon oxynitride film on the resist underlayer film;
(II-3) applying the material for forming an adhesive film according to claim 1 on the inorganic hard mask middle layer film and then performing a heat treatment to form an adhesive film;
(II-4) forming a resist upper layer film on the adhesive film by using a photoresist material;
(II-5) subjecting the resist upper layer film to pattern exposure and then to development with a developer to form a pattern in the resist upper layer film;
(II-6) transferring the pattern to the adhesive film by dry etching while using the resist upper layer film having the formed pattern as a mask;
(II-7) transferring the pattern to the inorganic hard mask middle layer film by dry etching while using the adhesive film having the formed pattern as a mask; and
(II-8) transferring the pattern to the resist underlayer film by dry etching while using the inorganic hard mask middle layer film having the transferred pattern as a mask.

11. The patterning process according to claim 10, wherein the inorganic hard mask middle layer film is formed by a CVD method or an ALD method.

12. The patterning process according to claim 9, wherein photolithography at a wavelength of 10 nm or more to 300 nm or less, a direct drawing by electron beam, a nanoimprinting, or a combination thereof is employed as a method for forming a circuit pattern in the resist upper layer film.

13. The patterning process according to claim 9, wherein alkaline development or development with an organic solvent is employed as a development method.

14. The patterning process according to claim 9, wherein the substrate to be processed is a semiconductor device substrate or the semiconductor device substrate coated with any of a metal film, a metal carbide film, a metal oxide film, a metal nitride film, a metal oxycarbide film, and a metal oxynitride film.

15. The patterning process according to claim 14, wherein as the metal, silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof is used.

16. A method for forming an adhesive film that functions as an adhesive layer employed in a semiconductor device manufacturing process, the method comprising:
   spin-coating a substrate to be processed with the material for forming an adhesive film according to claim 1; and
   heating the substrate coated with the material for forming an adhesive film at a temperature of 100° C. or higher to 300° C. or lower for 10 to 600 seconds to form a cured film.

17. A method for forming an adhesive film that functions as an adhesive layer employed in a semiconductor device manufacturing process, the method comprising:
   spin-coating a substrate to be processed with the material for forming an adhesive film according to claim 1; and
   heating the substrate coated with the material for forming an adhesive film in an atmosphere having an oxygen concentration of 0.1% or more to 21% or less to form a cured film.

18. A method for forming an adhesive film that functions as an adhesive layer employed in a semiconductor device manufacturing process, the method comprising:
   spin-coating a substrate to be processed with the material for forming an adhesive film according to claim 1; and
   heating the substrate coated with the material for forming an adhesive film in an atmosphere having an oxygen concentration of less than 0.1% to form a cured film.

* * * * *